(12) United States Patent
Suehira et al.

(10) Patent No.: US 8,845,317 B2
(45) Date of Patent: Sep. 30, 2014

(54) ALIGNMENT METHOD, IMPRINT METHOD, ALIGNMENT APPARATUS, AND POSITION MEASUREMENT METHOD

(75) Inventors: Nobuhito Suehira, Kawasaki (JP); Junichi Seki, Yokohama (JP); Hideki Ina, Tokyo (JP); Koichi Sentoku, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 13 days.

(21) Appl. No.: 11/719,878

(22) PCT Filed: Apr. 18, 2007

(86) PCT No.: PCT/JP2007/058898
§ 371 (c)(1),
(2), (4) Date: Sep. 5, 2008

(87) PCT Pub. No.: WO2007/123249
PCT Pub. Date: Nov. 1, 2007

(65) Prior Publication Data
US 2009/0108483 A1    Apr. 30, 2009

(30) Foreign Application Priority Data

Apr. 18, 2006 (JP) ................. 2006/114093
Nov. 10, 2006 (JP) ................. 2006/305239
Feb. 16, 2007 (JP) ................. 2007/036598

(51) Int. Cl.
| | |
|---|---|
| *G01B 11/00* | (2006.01) |
| *B29C 43/58* | (2006.01) |
| *B82Y 10/00* | (2011.01) |
| *G03F 9/00* | (2006.01) |
| *B82Y 40/00* | (2011.01) |
| *G03F 7/00* | (2006.01) |

(52) U.S. Cl.
CPC ............ *G03F 7/0002* (2013.01); *B82Y 10/00* (2013.01); *G03F 9/00* (2013.01); *B82Y 40/00* (2013.01); *G03F 9/703* (2013.01); *G03F 9/7049* (2013.01); *G03F 9/7088* (2013.01)
USPC ......................................... 425/150; 264/316

(58) Field of Classification Search
CPC ...... G01B 11/00; G01B 11/002; B29C 43/00; B29C 43/32; B29C 43/58
USPC ..................... 425/150, 135; 264/319; 156/64
See application file for complete search history.

(56) References Cited

U.S. PATENT DOCUMENTS 4,626,907 A * 12/1986 Schedewie ............... 348/95
4,669,883 A    6/1987 Ina et al. ................. 356/401

(Continued)

FOREIGN PATENT DOCUMENTS

| JP | 11-340120 | 12/1999 |
| JP | 2003-163163 A | 6/2003 |

(Continued)

OTHER PUBLICATIONS

M. Idesawa, Y. Yatagai, T. Soma, "Scanning moire method and automatic measurement of 3-D shapes", Applied Optics 1977, 16(8), 2152-2162.*

(Continued)

*Primary Examiner* — Christina Johnson
*Assistant Examiner* — Elizabeth Royston
(74) *Attorney, Agent, or Firm* — Fitzpatrick, Cella, Harper & Scinto

(57) ABSTRACT

An imprint apparatus for performing alignment between a mold and a substrate and imprinting a pattern of the mold to a layer of the substrate. A holder holds the mold. A stage holds the substrate opposite to the mold held by the holder. A microscope, including an image pickup device, detects a first alignment mark formed in the mold, via a first image pickup area of the image pickup device, and detects a second alignment mark formed in the substrate, via a second image pickup area of the image pickup device. The first and second image pickup areas do not overlap with each other. A contrast of signals obtained by the image pickup device is adjusted with respect to each of the first and second image pickup areas, and the alignment is performed by changing relative positions of the holder and the stage based on first information about a deviation of the detected first alignment mark from a predetermined position in the first image pickup area and second information about a deviation of the detected second alignment mark from a predetermined position in the second image pickup area.

9 Claims, 16 Drawing Sheets

(56) References Cited

U.S. PATENT DOCUMENTS

| | | | |
|---|---|---|---|
| 4,883,359 A | 11/1989 | Ina et al. | 356/401 |
| 4,901,109 A | 2/1990 | Mitome et al. | 355/68 |
| 4,952,060 A | 8/1990 | Ina et al. | 356/407 |
| 5,160,957 A | 11/1992 | Ina et al. | 355/43 |
| 5,323,207 A | 6/1994 | Ina | 355/53 |
| 5,585,923 A | 12/1996 | Nose et al. | 356/363 |
| 5,717,492 A | 2/1998 | Sentoku et al. | 356/401 |
| 6,124,922 A | 9/2000 | Sentoku | 355/53 |
| 6,151,120 A | 11/2000 | Matsumoto et al. | 356/399 |
| 6,154,281 A | 11/2000 | Sentoku et al. | 356/401 |
| 6,421,124 B1 | 7/2002 | Matsumoto et al. | 356/401 |
| 6,529,625 B2 | 3/2003 | Sentoku et al. | 382/151 |
| 6,559,924 B2 | 5/2003 | Ina et al. | 355/53 |
| 6,607,527 B1* | 8/2003 | Ruiz et al. | 606/41 |
| 6,639,677 B1 | 10/2003 | Ina et al. | 356/401 |
| 6,696,220 B2 | 2/2004 | Bailey et al. | |
| 6,992,780 B2 | 1/2006 | Sentoku et al. | 356/620 |
| 7,035,759 B2 | 4/2006 | Oishi et al. | 702/150 |
| 7,103,497 B2 | 9/2006 | Matsumoto et al. | 702/150 |
| 7,110,116 B2 | 9/2006 | Oishi et al. | 356/401 |
| 7,148,973 B2 | 12/2006 | Sentoku et al. | 356/620 |
| 7,173,716 B2 | 2/2007 | Oishi et al. | 356/620 |
| 7,247,868 B2 | 7/2007 | Suzuki et al. | 250/492.22 |
| 2005/0067379 A1 | 3/2005 | Sreenivasan et al. | 216/44 |
| 2006/0045313 A1* | 3/2006 | Gao et al. | 382/106 |
| 2006/0241894 A1 | 10/2006 | Matsumoto et al. | 702/150 |
| 2008/0094629 A1* | 4/2008 | Wu et al. | 356/401 |

FOREIGN PATENT DOCUMENTS

| | | |
|---|---|---|
| JP | 2005-116978 A | 4/2005 |
| WO | WO 95/14575 | 6/1995 |
| WO | WO 2006/024908 | 3/2006 |

OTHER PUBLICATIONS

N. Suehira, A. Terasaki, S. Okushima, J. Seki, H. Ono, "Position measurement method for alignment in UV imprint using a high index mold and "electronic" moire technique", J. Vac. Sci. Technol. B 2007, 25, 853-856.*

Stephen Y. Chou, et al., "Imprint of Sub-25 nm Vias and Trenches in Polymers", Applied Physical Letters, vol. 67, Issue 21, Sep. 1995, pp. 3114-3116.

International Search Report dated Jul. 20, 2007, which was mailed in a Communication dated Mar. 18, 2008, and which issued in corresponding International Application No. PCT/JP2007/058898.

Written Opinion of the International Searching Authority mailed Mar. 18, 2008, issued in International Application No. PCT/JP2007/058898.

Chinese Office Action dated Jun. 7, 2010, issued in Chinese patent application No. 200780013834.4, with an English translation.

Chinese Official Action dated Aug. 10, 2011, issued in counterpart Chinese patent application No. 200780013834.4, with a English translation.

English translation of Korean Office Action dated Sep. 16, 2010, issued in counterpart Korean patent application No. 10-2008-7028097.

Notice of Allowance mailed Apr. 1, 2011, from the Korean Intellectual Property Office in counterpart Korea patent application No. 10-2008-7028097.

English translation of Korean Patent Publication No. 10-2005-004935.

Chinese Official Action dated Apr. 12, 2013, issued in counterpart Chinese Patent Application No. 201019538354.5, with an English translation.

* cited by examiner

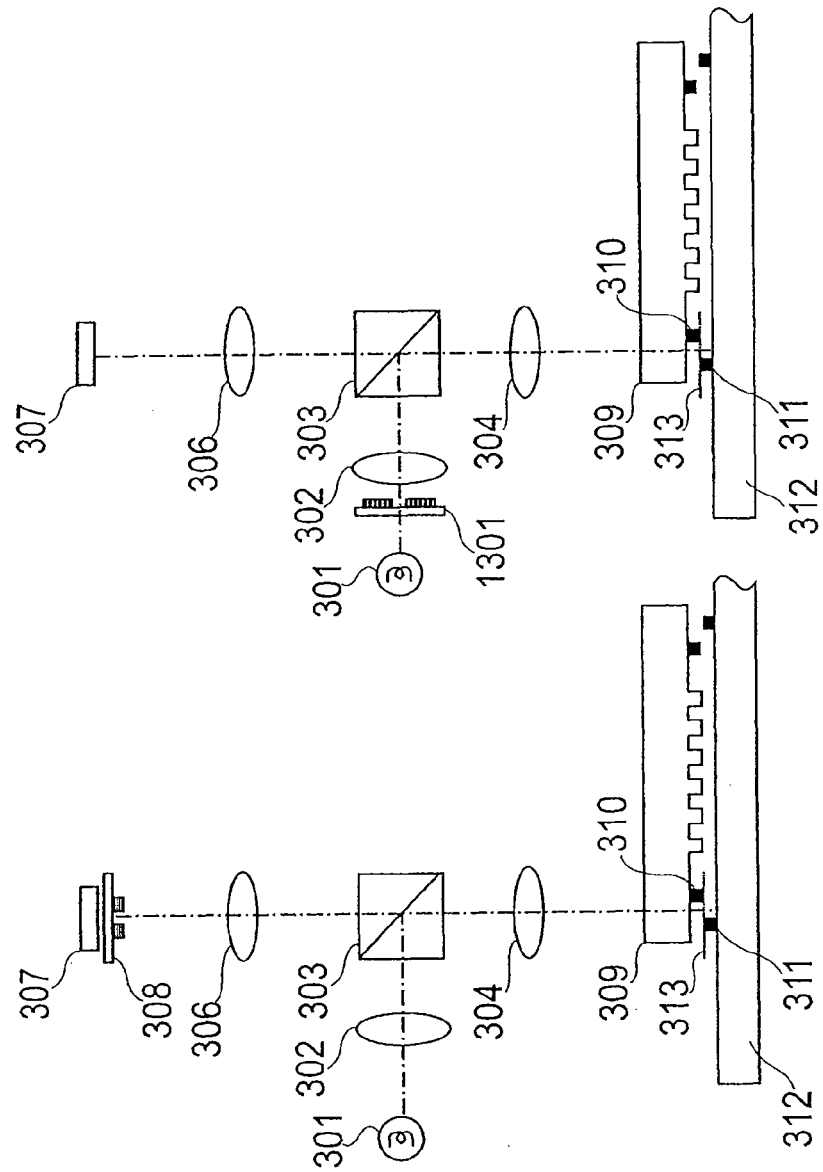

(c)

(d)

ALIGNMENT METHOD, IMPRINT METHOD, ALIGNMENT APPARATUS, AND POSITION MEASUREMENT METHOD

This application claims priority from Japanese Patent Application No. 2006-114093, filed Apr. 18, 2006, Japanese Patent Application No. 2006-305239, filed Nov. 10, 2006, and Japanese Patent Application No. 2007-036598, filed Feb. 16, 2007, each of which is hereby incorporated by reference herein.

TECHNICAL FIELD

The present invention relates to an alignment method, an imprint method, an alignment apparatus, and a position measurement method.

BACKGROUND ART

In recent years, as described in Appl. Phys. Lett., Vol. 67, Issue 21, pages 3114-3116 (1995) by Stephan Y. Chou et al., a fine processing technology, for pressure-transferring a fine structure provided on a mold onto a work (or workpiece), such as a semiconductor, glass, resin, or metal, has been developed and has received attention. This technology is called "nanoimprint" or "nanoembossing" since it has a resolving power on the order of several nanometers. In addition to semiconductor manufacturing, the technology is capable of effecting simultaneous processing of a three-dimensional structure at a wafer level. For this reason, the technology has been expected to be applied to a wide variety of fields, such as manufacturing technologies, and the like, for optical devices, such as a photonic crystal, and the like, μ-TAS (micro total analysis systems), biochips, etc.

The case in which such nanoimprint, e.g., an optical imprint method, is used in the semiconductor fabrication will be described below.

First, on a substrate (e.g., a semiconductor wafer), a resin layer of a photocurable resin material is formed. Next, against the resin layer, a mold, on which a desired imprint pattern is formed, is pressed, followed by irradiation with ultraviolet rays, to cure the photocurable resin material. As a result, the imprint structure is transferred onto the resin layer. Then, etching, or the like, with the resin layer as a mask is effected to form a desired structure on the substrate.

Incidentally, in the semiconductor manufacturing, it is necessary to effect (positional) alignment of the mold with the substrate. For example, in such a current circumstance that a semiconductor process rule is not more than 100 nm, a tolerance of an alignment error due to an apparatus is such a severe degree that it is said to be several nanometers to several tens of nanometers.

As such an alignment method, e.g., U.S. Pat. No. 6,696,220 has proposed a method in which a mold and a substrate are caused to contact each other, in a state in which a resinous material is interposed therebetween, to effect alignment. In this method, first, a photocurable resin material is selectively applied to a portion of the substrate other than an alignment mark provided to the substrate. Next, the substrate is moved to a position opposite to the mold. In this state, a distance between the mold and a work (the substrate provided with the photocurable material) is decreased, so that the mold is caused to come near to such a distance that the alignment mark is not filled with the resin material. In the method, the alignment is effected in this state and thereafter, final pressure application is performed. In the method, an optical system for alignment employs such an observation method that only a portion having a small depth of focus in the neighborhood of the alignment mark on the mold side is observed.

More specifically, the marks provided on the mold and the substrate, respectively, are formed into an image in a single image pickup device by utilizing chromatic aberration.

However, references of the mold and the substrate are actually different from each other in many cases. In a case in which a mark provided to a mold formed of quartz having a high transmittance, and a mark provided to a substrate formed of silicon having a high reflectance, overlap each other, when the marks are projected in a perpendicular direction, the mold-side mark in a pickup image can be optically blocked by the substrate-side mark.

In such a state, images of the alignment marks provided to the mold and the substrate, respectively, cannot be picked up with a sufficient gradation range, so that a high detection resolution cannot be attained in some cases.

DISCLOSURE OF THE INVENTION

In view of the above-described problems, a principal object of the present invention is to provide an alignment method and an imprint method, which are capable of solving the above-described problems.

Another object of the present invention is to provide and alignment apparatus and an imprint apparatus capable of carrying out the alignment method and the imprint method.

A further object of the present invention is to provide a position measurement method for measuring a relative positional relationship of two objects or an amount of relative movement between the two objects.

According to a first aspect, the present invention provides an alignment method for effecting alignment between two plate-like objects by using a light source and an image pickup device, the alignment method comprising:

disposing a first plate-like object provided with a first alignment mark and a second plate-like object provided with a second alignment mark opposite to each other;

providing a first area and a second area at mutually non-overlapping positions in an image pickup area for being observed through the image pickup device;

picking up images of the first and second alignment marks by the image pickup device from a direction substantially perpendicular to an in-plane direction of the first and second plate-like objects;

effecting alignment control for aligning positions of the first and second plate-like objects in the in-plane direction with each other by using first information about a deviation of the first alignment mark from a predetermined position in the first area and second information about a deviation of the second alignment mark from a predetermined position in the second area; and adjusting a gap between the first and second plate-like objects, so that the gap is 3 μm or less by decreasing the gap, while effecting the alignment control.

In the alignment method, each of the images of the first and second alignment marks picked up by the image pickup device may preferably be adjusted in contrast.

Further, by causing the first and second areas to have an identical planar area, or the same number of pixels of the image pickup device, signal processing, such as a Fourier transform, in a subsequent step, is facilitated. Magnification correction of images observed in the first and second areas can be made, depending on a change in magnification resulting from heights of the first and second plate-like objects.

According to a second aspect, the present invention provides an alignment process for effecting the above-described alignment method.

The alignment apparatus comprises a first movable means for moving at least one of the first and second plate-like objects in the in-plane direction, and a second movable means for moving at least one of the first and second plate-like objects in a direction perpendicular to the in-plane direction.

According to a third aspect, the present invention provides an imprint method for effecting alignment between two plate-like objects by using a light source and an image pickup device to imprint an imprint pattern provided to one of the two plate-like objects on the other plate-like object, or a pattern forming layer formed on the other plate-like object, the imprint method comprising:

disposing a mold as a first plate-like object provided with a first alignment mark and a substrate as a second plate-like object provided with a second alignment mark opposite to each other;

providing a first area and a second area at mutually non-overlapping positions in an image pickup area for being observed through the image pickup device;

detecting the first and second alignment marks by the image pickup device from a direction substantially perpendicular to an in-plane direction of the first and second plate-like objects;

effecting alignment control for aligning positions of the first and second plate-like objects in the in-plane direction with each other by using first information about a deviation of the first alignment mark from a predetermined position in the first area and second information about a deviation of the second alignment mark from a predetermined position in the second area; and imprinting an imprint pattern provided to the mold as the first plate-like object on the substrate as the second plate-like object or a pattern forming layer formed on the substrate.

According to a fourth aspect, the present invention provides an imprint apparatus for effecting an alignment method according to the third aspect of the present invention. The imprint apparatus comprises a first movable means for moving at least one of the first and second plate-like objects in the in-plane direction, and a second movable means for moving at least one of the first and second plate-like objects in a direction perpendicular to the in-plane direction.

According to a fifth aspect, the present invention provides an alignment method for effecting alignment between two plate-like objects by using an image pickup device. The alignment method comprises:

disposing a first plate-like object provided with a first periodic structure with a pitch $P_1$ as an alignment mark and a second plate-like object provided with a second periodic structure with a pitch $P_2$ as an alignment mark, opposite to each other;

providing a first area and a second area at mutually non-overlapping positions in an image pickup area for being observed through the image pickup device;

picking up images of the first and second periodic structures in the first and second areas, respectively, by the image pickup devices from a direction substantially perpendicular to an in-plane direction of the first and second plate-like objects;

effecting alignment between the first and second plate-like objects in the in-plane direction by extracting basic frequencies corresponding to the first and second periodic structures, respectively, from information about the picked up images, performing computation with the basic frequencies to extract a moire fringe component, and using information about a positional deviation of the first and second plate-like objects in the in-plane direction obtained from the moire fringe component.

According to a sixth aspect, the present invention provides a position measurement method for measuring positions of two objects by using an image pickup device. The position measurement method comprises:

disposing a first object provided with a first periodic structure with a pitch $P_1$ as an alignment mark and a second object provided with a second periodic structure with a pitch $P_2$ as an alignment mark, opposite to each other;

providing a first area and a second area at mutually non-overlapping positions in an image pickup area for being observed through the image pickup device;

picking up images of the first and second periodic structures in the first and second areas, respectively, by the image pickup device from a direction substantially perpendicular to an in-plane direction of the first and second objects;

effecting position measurement of the first and second objects in the in-plane direction by extracting basic frequencies corresponding to the first and second periodic structures, respectively, from information about the picked up images, and performing computation with the basic frequencies to extract a moire fringe component.

According to a seventh aspect, the present invention provides an imprint method comprising:

transferring a pattern formed on a processing surface of a mold onto a resin material provided on a surface of a substrate by curing the resin material, wherein, when an alignment mark provided to a mold is observed through an image pickup device, a wavelength of light entering the image pickup device depends on a gap between the mold and the substrate or a thickness of a member constituting the alignment mark.

According to an eighth aspect, the present invention provides an alignment method for effecting alignment between two members using an image pickup device. The alignment method comprises:

disposing a first member provided with a first alignment mark and a second member provided with a second alignment mark opposite to each other;

obtaining first image information about the first alignment mark in a first area in an image pickup area for being observed through the image pickup device;

performing computation of the first image information and the second information; and effecting alignment between the two members by using the first image information and the second image information. In this alignment method, the computation may be performed by using the first image information and the second image information, which are obtained at portions at which the first area and the second area do not overlap each other.

According to a ninth aspect, the present invention provides an alignment method for effecting alignment between two plate-like objects by using an image pickup device. The alignment method comprises:

disposing a first plate-like object provided with a first periodic structure with a pitch $P_1$ as an alignment mark and a second plate-like object provided with a second periodic structure with a pitch $P_2$ as an alignment mark, opposite to each other;

providing a first area and a second area at mutually non-overlapping positions in an image pickup area for being observed through the image pickup device;

picking up images of the first and second periodic structures in the first and second areas, respectively, by the image pickup device from a direction substantially perpendicular to an in-plane direction of the first and second plate-like objects;

obtaining positional information about a relative position between the first and second plate-like objects by performing computation of image information obtained from the images picked up by the image pickup device; and effecting alignment between the first and second plate-like objects in the in-plane direction by using the positional information.

These and other objects, features and advantages of the present invention will become more apparent upon a consideration of the following description of the preferred embodiments of the present invention, taken in conjunction with the accompanying drawings.

BRIEF DESCRIPTION OF THE DRAWINGS

FIGS. 2A to 2B are schematic views for illustrating a measurement optical system in the present invention, wherein FIG. 2A is a view for illustrating a constitution in which light, which reaches respective positions of an image pickup device, is adjusted by an optical device, and FIG. 2B is a view for illustrating a constitution in which light, which reaches respective positions of an image pickup device, is adjusted by a light source-side optical device.

FIGS. 3A to 3B are schematic views for illustrating rating a measurement optical system in the present invention, wherein FIG. 3A is a view for illustrating a constitution in which light is adjusted by a light amount control apparatus, and FIG. 3B is a view for illustrating a constitution in which light is adjusted by a rotary shutter.

FIGS. 4A to 4D are schematic views for illustrating marks used in the present invention, wherein FIG. 4A shows a mold mark, FIG. 4B shows a substrate mark, FIG. 4C shows a mold mark having a periodic structure, and FIG. 4D shows a substrate mark having a periodic structure.

FIGS. 6A and 6B are flow charts for illustrating a signal processing method in the present invention, wherein FIG. 6A is a flow chart for illustrating a case in which magnification correction is not effected, and FIG. 6B is a flow chart for illustrating a case in which the magnification correction is effected.

FIGS. 18A to 18F are schematic views for illustrating alignment marks in Embodiment 3, wherein FIG. 18A is a view for illustrating a first alignment mark for uniaxial measurement, FIG. 18B is a view for illustrating a second mark for uniaxial measurement, FIG. 18C is a view for illustrating a composite image for uniaxial measurement, FIG. 18D is a view for illustrating a first alignment mark for XYθ measurement, FIG. 18E is a view for illustrating a second alignment mark for XYθ measurement, and FIG. 18F is a view for illustrating a composite image for XYθ measurement.

BEST MODE FOR CARRYING OUT THE INVENTION

First Embodiment

An alignment method according to the present invention for effecting alignment between two plate-like objects by using a light source and an image pickup device will be described with reference to FIGS. 1A, 1B and 1C.

Figure 1A:
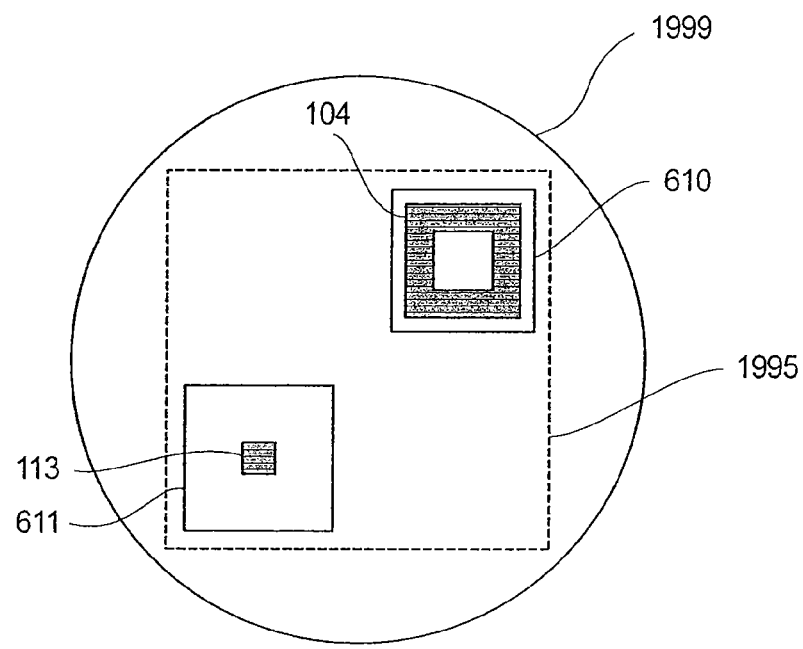
FIGS. 1A to 1C are schematic views showing a relationship between alignment marks for illustrating the present invention.

FIG. 1A is a top view for illustrating an image of an image pickup area 1995 observed through an image pickup device located in a visible range 1999 in a body tube of a microscope. FIG. 1B is a sectional view for illustrating a state of the two plate-like objects disposed opposite to each other when these plate-like objects are viewed in a direction parallel to an in-plane direction thereof. FIG. 1C includes line profiles of marks which are specifically described later.

In the alignment method, first, a first plate-like object provided with a first alignment mark 104 and a second plate-like object 312 provided with a second alignment mark 113 are disposed opposite to each other. In these cases, a first area 610 and a second area 611 are provided at mutually non-overlapping positions in the image pickup area 1995 observed through the image pickup device. These two areas have been located within the image pickup area.

When images of the first and second alignment marks are picked up by the image pickup device from a direction substantially perpendicular to an in-plane direction of the first and second plate-like objects, an image as shown in FIG. 1A is obtained.

Here, setting is made so that the alignment between the first and second plate-like objects is completed when the first alignment mark 104 of the first plate-like object 309 is located at a position of a center of gravity of or a center of the first area 610 and the second alignment mark 113 of the second plate-like object 312 is located at a position of a center of gravity of or a center of the second area 611. The completion of the alignment means that a desired condition (or degree) of the alignment between the two plate-like objects, with respect to the in-plane direction of the two plate-like objects, is satisfied. Actual alignment is effected in the following manner.

First information about a deviation of the first alignment mark from a predetermined position in the first area (e.g., the center of the first area) is obtained. Further, the second information about a deviation of the second alignment mark from a predetermined position in the second area (e.g., the center of the second area) is obtained. The order of obtaining the first information and the second information is not particularly limited. The first information and the second information may also be obtained at the same time. Based on these two pieces of information, alignment control for aligning the first and second plate-like objects with each other in the in-plane direction is performed.

The alignment control may, e.g., be performed in the following manner.

First, in a case in which driving mechanisms for driving (moving) the first and second plate-like objects, respectively, in the in-plane direction are provided, the alignment is effected so that each of the alignment marks for the first and second plate-like objects is located at the predetermined position.

Alternatively, either one of the two plate-like objects is fixed and the other plate-like object, movable in the in-plane direction, is moved in consideration of two pieces of information consisting of information about a positional deviation of the other plate-like object, and information about a positional deviation of the fixed plate-like object. For example, in the case in which the position of the fixed first plate-like object is deviated from the predetermined position by five scales in a right direction in the first area, and the position of the second plate-like object is deviated from the predetermined position by two scales in a left direction in the second area, the alignment is effected in the following manner.

The position of the second plate-like object is not moved in the right direction by two scales, but is moved in the right direction by seven scales (two+five scales). This is merely an example.

In the case in which the driving mechanism with respect to the in-plane direction is provided for only one of the first and second plate-like objects, positional adjustment is made by the above-described manner.

Further, in the case in which an optical axis of an optical system is movable, it is also possible to adopt correction of the optical axis by moving the optical system, including a lens, and the like, into the alignment control.

When the positions of the first and second plate-like objects are adjusted at desired positions, a distance (gap) between the first and second plate-like object is gradually decreased, while the alignment control (e.g., feedback control) is performed so as to maintain an adjusted positional relationship between the first and second plate-like objects in the in-plane direction. The first and second plate-like objects are brought near to each other so that the gap is 3 μm or less. In the case in which the alignment method of this embodiment is applied to an imprint method, the gap may preferably be 1 μm or less.

Further, in the case in which a photocurable or thermosetting resin material is interposed between the first and second plate-like objects and a pattern provided to the first plate-like object or the second plate-like object is transferred onto the resin material, the distance (gap) between the first and second plate-like objects may preferably be decreased to 300 nm or less, more preferably, 200 nm or less, further preferably 100 nm or less. This is because a film having a thickness corresponding to the distance (gap) remains as a residual film after the resin material is cured or hardened.

In this embodiment, in the case in which the first and second marks provided to the first and second plate-like objects, respectively, are observed, it is also possible to perform adjustment in contrast to each of the first and second marks or to perform adjustment in signal to noise ratio of each of the first and second marks.

Herein, below, a case in which the first and second alignment marks of the first and second plate-like objects are observable by a single image pickup device, i.e., a case in which both of the marks are located within the same depth of focus, will be described.

Now, a case in which the marks of a mold and a substrate, which are different in reflectance, overlap each other, is considered. In this state, when signal processing is performed, a sufficient contrast is not ensured, to impede accurate measurement, in some cases.

For example, in the case in which the first plate-like object is a mold having an imprinting pattern, an alignment mark provided to the mold has an increased transmittance. For example, in the case in which the mold is formed of quartz, the alignment mark is constituted by projections and recesses provided to the quartz mold. On the other hand, in the case in which the second plate-like objects as a substrate provided with an alignment mark is formed of, e.g., silicon, a contrast of the alignment mark of the mold (first plate-like object) is liable to be lower than the alignment mark of the substrate (second plate-like object), due to differences in transmittance and reflectance between the alignment marks of the mold and the substrate. For this reason, the mold side mark can be optically blocked by the substrate side mark.

Accordingly, as in this embodiment, in the case in which both of the marks are observed from the perpendicular direction, it is possible to adjust a contrast with respect to each of the mark images by disposing the respective mark observation areas at positions at which the areas do not optically affect each other.

The contrast may be adjusted by adjusting light entering the image pickup device by means of the optical system or by changing an exposure time for the image pickup device.

The reason why the marks are observed from the perpendicular direction is that a change in mark position due to movement of the mold or the substrate in an image pickup range of the image pickup device can be eliminated, since the mold or the substrate is moved in a z-(axis) direction (a direction perpendicular to the in-plane direction of the plate-like objects) when the imprint is effected. In the case of oblique observation, a signal processing method corresponding to a mark position change is required to be performed, thus complicating the imprint method.

Further, when the imprint is effected, different from a conventional exposure apparatus, a gap between a mask and a substrate is not constant. For this reason, a magnification is changed with movement in the z-direction, so that signal processing depending on the change in magnification is required, in some cases. Such signal processing is simpler in the case of the perpendicular observation, since the change is isotropic.

Referring again to FIGS. 1A to 1C, the description will be continued. In this embodiment, the mold, as the first plate-like object, and the substrate, as the second plate-like object, are disposed so as not to optically overlap each other.

Figure 1B:
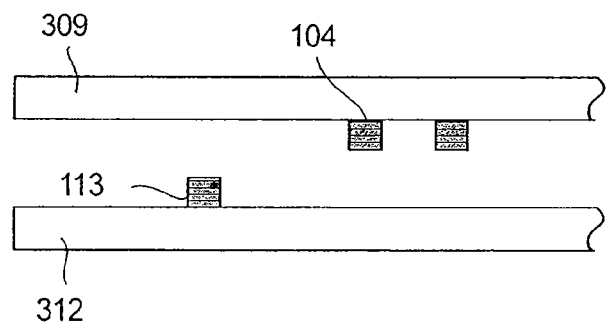
Figure 1C:
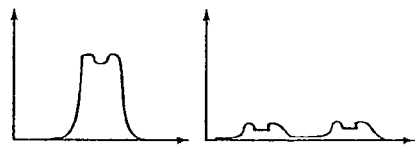

Referring to FIG. 1A (top view) and FIG. 1B (sectional view), a first area A (610) and second area B (611) of the image pickup device are diagonally provided at corner portions. In the first area A (610) and the second area B (611), a mold-side alignment mark 104 and a substrate-side alignment mark 113 are adjusted in position so as to be disposed, respectively. The disposition (arrangement) of these two areas is not particularly limited, so long as they do not optically overlap each other.

In the image pickup area 1995, a distance between the mold-side alignment mark and the substrate-side alignment mark is several tens of micrometers to several hundreds of micrometers. Further, a gap (distance in z-direction) between the mold and the substrate is several micrometers. For this reason, even in consideration of numerical aperture of the microscope, the distance and the gap do not adversely affect the first area A and the second area B.

Accuracy of a stage is on the order of sub-micrometers or nanometers, and sometimes, on the order of sub-nanometers, so that it is possible to easily create such a state. FIG. 1C illustrates a state when the marks on both of the mold and substrate sides are observed. More specifically, a left-hand view shows a line profile of the substrate-side alignment mark 113 (FIG. 1A) and a right-hand view shows a line profile of the mold-side alignment mark 104 (FIG. 1A), wherein an abscissa represents a position and an ordinate represents a light intensity. From these line profiles, it is found that the silicon substrate and the quartz mold have largely different reflectances. The marks have a line width of, e.g., sub-nanometers to several micrometers and a depth (height) of e.g., several tens of nanometers to several micrometers. For this reason, the width and the depth of the marks can be less than a wavelength of light (e.g., 400-800 nm), so that edges of the marks are deformed compared with an original shape thereof to have such a shape that lower portions of the edges are trailed. In this embodiment, in which both of the marks are sufficiently spaced apart from each other, the marks do not adversely affect each other.

Other advantages of the case in which the marks for the mold and the substrate are disposed in the separate areas and information about the marks is obtained, as described above, will be described.

In the case of effecting the imprint, it is necessary to effect the alignment between the mold and the substrate while decreasing the gap between the mold and the substrate. Even in the case in which the marks are located within the depth of focus, an optical magnification changes depending on the height of the mold or the substrate. The change is a serious problem in the imprint requiring high-accuracy alignment.

Even in such a case, when the mold and the substrate are sufficiently spaced apart from each other, it is possible to facilitate correction of magnification depending on the change in magnification. The magnification correction can be realized by comparing, e.g., the distance between the marks with an original designed value. In the case of the perpendicular observation, the magnification change is isotropic, so that the correction can be made easily. In the case of an oblique observation, sizes of the patterns on a close side and a distance side are observed so as to be different from each other, so that the correction of magnification is complicated.

FIG. 2A shows a constitution in which a contrast is adjustable depending on a position or place in an image pickup area of an image pickup device 3-7 of a CCD (charge coupled device) type or a MOS (metal-oxide-semiconductor) type. In front of the image pickup device 307, a first optical device 308 different in characteristic, depending on the position, is disposed. The optical device is constituted by a color filter, an interference filter, an ND (neutral-density) filter, a polarizer, and a combination thereof, or the like. Incidentally, as will be described in the Fourth Embodiment appearing hereafter, it is also preferable, from the viewpoint of an improvement in contrast, that a transmission wavelength range of a filter provided on a light source side or the image pickup device side is changed, depending on the gap between the mold and the substrate. The constitution shown in FIG. 2A includes a light source 301, an illumination optical system 302, a first beam splitter 303, a first image-forming optical system 304, a second image-forming optical system 306, a mold 309 provided with an imprinting pattern and an alignment mark 310, a substrate 312, such as a silicon wafer, provided with an alignment mark 311, and a first object position 313.

FIG. 2B shows another arrangement, in which a contrast is adjustable depending on a position or place in an image pickup area of an image pickup device 307. In this constitution, a first optical device different in characteristic depending on the position is disposed on a light source side. The optical device is constituted by a color filter, an interference filter, an ND filter, a polarizer, and a combination thereof, or the like.

Figures 3A, 3B:
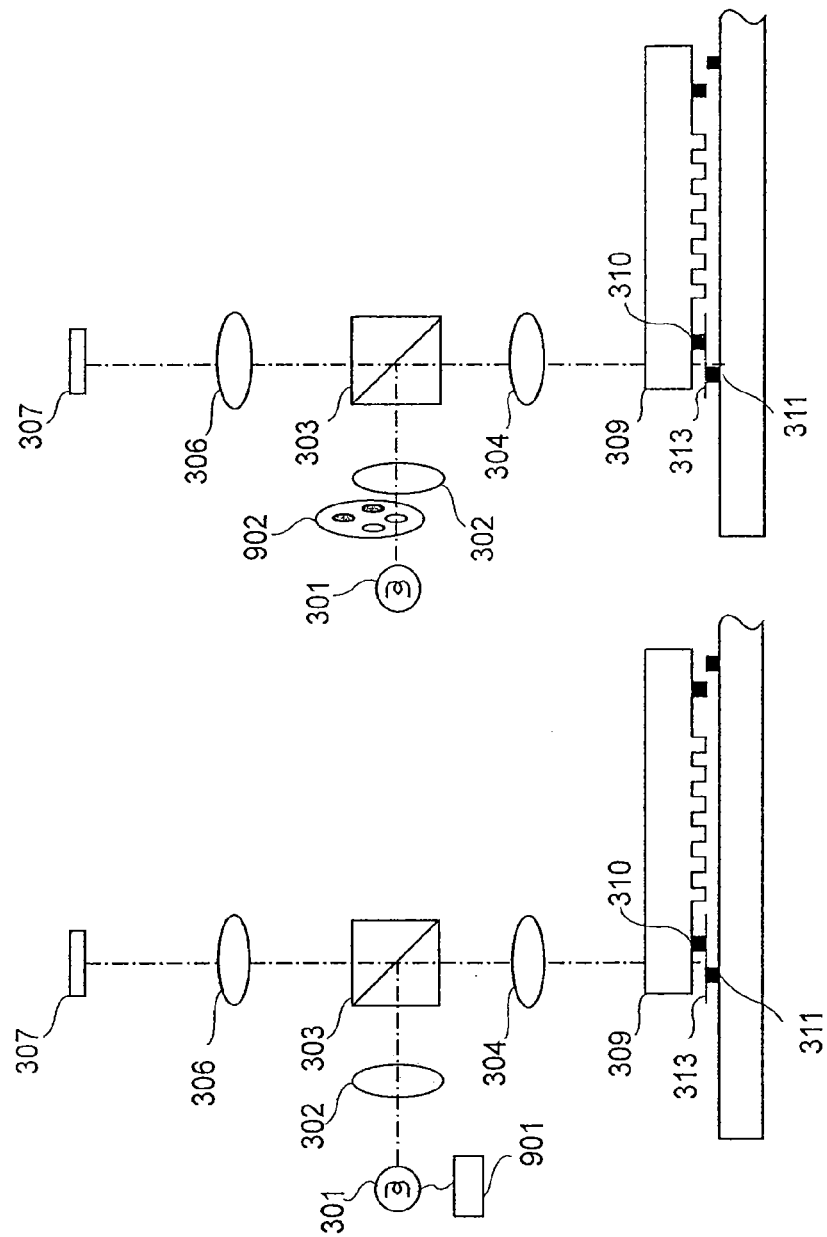

FIG. 3A shows a constitution of an optical system in which a light amount control mechanism 901 for adjusting an amount of light in correspondence with each of marks for the mold and the substrate is used in order to effect contrast adjustment. As a result, the light amount control can be performed depending on reflectances, or the like, of the mold and the substrate. In this constitution, images of the mold mark and the substrate mark are separately picked up, so that it is necessary to pickup the images two or more times at a first amount of light and a second amount of light. An explanation of the constitution common to the constitution shown in FIGS. 2A and 2B will omitted.

FIG. 3B shows a constitution in which a rotary shutter 902 for changing an amount light from the light source 301 is used. Depending on reflectances of the mold and the substrate at their mark positions, a shutter position of the rotary shutter 902 is switched. Also, in this constitution, it is necessary to pick up the images two or more times. The image pickup operation may be effected by changing the light amount, as described above, or changing an exposure time or gain of the image pickup device 307, depending on characteristics of the mold and the substrate.

Figure 4A:
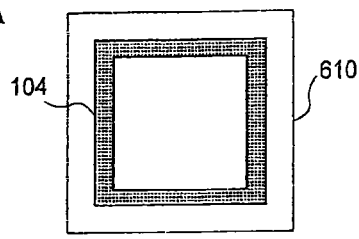
Figure 4C:
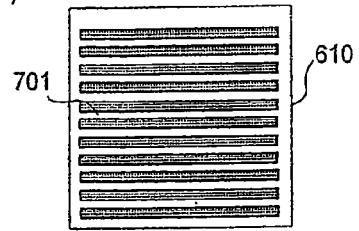
Figure 4B:
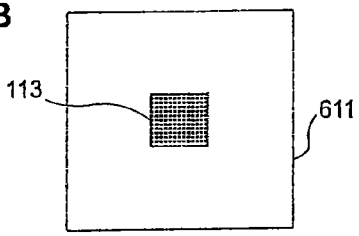

FIGS. 4A and 4B show examples of marks used in a box-in-box type alignment method for effecting alignment between the mold and substrate.

In these figures, a mold-side alignment mark 104 is provided in a first area A (610) and a substrate-side alignment mark 113 is provided in a second area B (611). In the case of using a single image pickup device, an image of the first and second areas is picked up as shown in, e.g., FIG. 1A.

Then, image data in the first and second areas are obtained form the image pickup device and, as desired, are subjected to signal processing for obtaining profile data of the intensity of reflected light. During the alignment, positions of the mold and the substrate in their in-plane directions are adjusted so that the respective alignment marks are located at predetermined positions (e.g., positions of center of gravity or center positions) in the respective areas. Alternatively, it is also possible to effect the alignment so that an amount of relative deviation between the mold and the substrate obtained from superposed (overlaid) images, which are prepared by electronically superposing two images, is decreased.

The above-described alignment method of the First Embodiment is applicable to not only the imprint apparatus, but also, a contact exposure apparatus and a proximity exposure apparatus. Further, in an apparatus capable of coarse adjustment and fine adjustment, the coarse adjustment is made by a known alignment method, and then, the fine adjustment may be made by the above-described alignment method.

In the case in which two image pickup devices for picking up images in the first and second areas are used, information about a difference between the two image pickup areas is obtained in advance by using a standard (reference) substrate, or the like, as in Reference Embodiments described later, in order to perform compensation of the areas to be subjected to image pickup by the respective image pickup devices.

Second Embodiment

Imprint Method

An imprint method of a Second Embodiment will be described.

In this embodiment, the alignment between the two plate-like objects is effected by using the image pickup device(s), similar to that in the First Embodiment described above.

In this embodiment, imprint (transfer of an imprinting pattern) is performed, so that an imprint pattern provided to one object is transferred onto the other object or a pattern forming layer provided on the other object. In an actual operation, the imprinting pattern of a mold as one object is formed on the pattern forming layer as a reverse pattern thereof.

First, the mold as a first plate-like object having a first alignment mark and a substrate as a second plate-like object having a second alignment mark are disposed opposite to each other.

At a mutually non-overlapping position in an image pickup area observed through an image pickup device, a first area and a second area are provided, and then, the first and second alignment marks are detected by the image pickup device from a direction substantially perpendicular to in-plane directions of the two plate-like objects.

Thereafter, first information about a deviation of the first alignment mark from a predetermined position in the first area and second information about a deviation of the second alignment mark from a predetermined position in the second area are utilized. More specifically, on the basis of the two pieces of information, alignment control for aligning the first and second plate-like objects with each other with respect to the in-plane direction is effected.

Then, the imprinting pattern of the mold as the first plate-like object is transferred (imprinted) onto the substrate as the second plate-like object or the pattern forming layer on the substrate.

During the imprint, a pressing force is required in the case of direct contact between the substrate and the mold. In the case in which a resin material is interposed between the substrate and the mold and used as the pattern forming layer, the pressing force may be applied as desired.

(A) Mold

As the mold used in this embodiment, it is possible to employ a mold of quartz or a mold of silicon nitride.

Further, as a material for a surface layer of the mold, it is also preferable that the material is constituted in the following manner.

More specifically, as the material for the surface layer, by utilizing a material having a refractive index larger than 1.7, the alignment structures provided to the mold and the substrate (or a work) can be detected based on the difference in refractive index between the material and the photocurable resin material to permit the high-accuracy alignment.

The refractive index of the surface layer in the present invention is not less than 1.7, preferably, not less than 1.8, more preferably, not less than 1.9. Further, the refractive index may, e.g., be not more than 3.5 (upper limit). However, the upper limit of the refractive index is not restricted, as long as the resultant mold is usable in the present invention.

Further, in the case in which a part of the layer has the above-described refractive index, the surface layer may also be coated with another layer.

Generally, between substances having refractive indices largely different from each other, it is possible to visually recognize a structure based on refraction, reflection, or scattering at an interface therebetween. Accordingly, a contrast is more liable to be ensured as the refractive index of the surface layer of the mold is higher.

The upper limit of the refractive index is not particularly limited, as described above. Examples of a refractive index of representative dielectric members through which ultraviolet light passes may include 1.43 for calcium fluoride ($CaF_2$), 1.45 for quartz (typically represented by $SiO_2$), 1.78 for alumina (typically represented by $Al_2O_3$), 2.0 for silicon nitride (SiN), and approximately 2.4 for titanium oxide (typically represented by $TiO_2$). Examples of transmittances of these substances with respect to ultraviolet light of, e.g., a wavelength of approximately 365 nm, may include approximately 97% for $CaF_2$, approximately 90% for $SiO_2$, approximately 80% for $Al_2O_3$, approximately 60% for $TiO_2$, and approximately 90% for SiN. The upper limit of a refractive index of the surface layer-constituting material is not more than 3.5, preferably, not more than 3.0. The refractive index itself varies depending on a measurement wavelength, but the above-described data about the refractive index are those with respect to visible light (wavelength: 633 nm).

An embodiment of a constitution in which a material having a high refractive index is used as the surface layer of the mold, as described above, is shown in FIG. 5.

Figure 5:
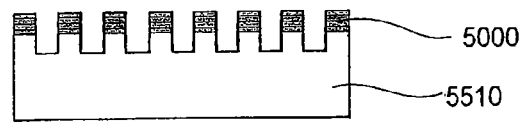
FIG. 5 is a schematic view showing an embodiment of a constitution of a mold applicable to the present invention.

Referring to FIG. 5, the mold includes a layer 5510 formed of quartz ($SiO_2$) (thickness: 525 μm) and a surface layer 5000 formed of the high refractive index material, such as SiN or $TiO_2$. The surface layer may have a thickness of, e.g., 50 nm for SiN and 60 nm for $TiO_2$. By using the high refractive index material, it is possible to observe such a phenomenon that the alignment mark for the mold is less visible by the resin material interposed between the mark and the substrate.

(B) Substrate

The above-described substrate is also called a work in the imprint apparatus in some cases.

Examples of the substrate may include a semiconductor substrate, such as an Si substrate (Si wafer) or a GaAs substrate, a resinous substrate, a quartz substrate, or a glass substrate. It is also possible to use a multi-layer substrate prepared in such a manner that a thin film is caused to grow on these substrates or bonded to these substrates. It is also possible to employ a light transmissive substrate of quartz.

(C) Resin Material

In order to interpose the resin material between the substrate and the mold, e.g., the resin material is applied onto the substrate by a dispenser.

The resin material applied onto the substrate is cured by irradiating the substrate with, e.g., ultraviolet rays from the mold side. An example of such a photocurable resin may include those of urethane-type, epoxy-type, and acrylic-type.

Further, as the resin material, it is also possible to use a thermosetting resin, such as a phenolic resin, an epoxy resin, a silicone resin, or polyimide, and a thermoplastic resin, such as polymethyl methacrylate (PMMA), polycarbonate (PC), polyethylene terephthalate (PET), or an acrylic resin. By using these resins, the pattern is transferred through heat treatment, as desired.

In the case in which the member to be processed (substrate) is constituted without containing the resin material, the member to be processed is physically deformed only by a pressing force.

Third Embodiment

Electronic Generation of Moire Fringes

The Third Embodiment of the present invention will be described.

More specifically, an alignment method of effecting alignment between two plate-like objects by using an image pickup device will be described.

First, a first plate-like object having a first periodic structure with a pitch P1 as an alignment mark and a second plate-like object having a second period structure with a pitch $P_2$ as an alignment mark are disposed opposite to each other.

Then, similar to that in the First Embodiment, a first area and a second area are provided at mutually non-overlapping positions in an image pickup area to be observed through the image pickup device.

By using the image pickup device, images of the first and second periodic structures are picked up in the first and second areas, respectively, from a direction substantially perpendicular to an in-plane direction of the first and second plate-like objects.

From image information obtained by picking up the image, basic frequencies corresponding to the first and second periodic structures, respectively, are extracted.

Further, by computing the extracted basic frequencies, a moire fringe component is extracted. From the extracted moire fringe component, information is obtained about positional deviation between the first and second plate-like objects with respect to the in-plane direction. By using this information, alignment between the first and second plate-like objects with respect to the in-plane direction is effected.

A specific explanation will be made below.

In the following description, the case of using a quartz mold as the first plate-like object and a wafer substrate, such as a silicon wafer, as the second plate-like object is explained as an example. However, it should be understood that the present invention according to this embodiment does not exclude plate-like objects other than such plate-like objects.

Figure 4D:
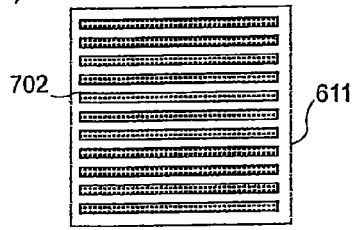

FIGS. 4C and 4D are schematic views each showing a constitution in which an alignment mark for the mold or the substrate is constituted by a grating. Referring to FIG. 4C, in a first area 610, a first periodic structure 701 (e.g., projections or recesses) with a pitch $P_1$ is provided as a mold-side alignment mark to be observed through the image pickup device. Further, referring to FIG. 4D, in a second area 611, a second periodic structure 702 (e.g., projections or recesses) with a pitch $P_2$ is provided as a substrate-side alignment mark to be observed through the image pickup device.

Signal processing for extracting basic frequencies corresponding to the first and second periodic structures from image information obtained from the image pickup device, extracting the above-described moire fringe component, and obtaining information about positional deviation from the moire fringe component will be described below.

Figure 6A:
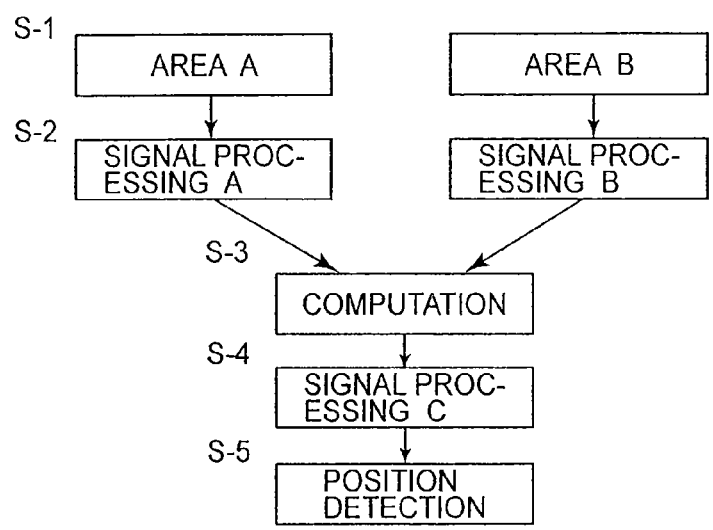
Figure 6B:
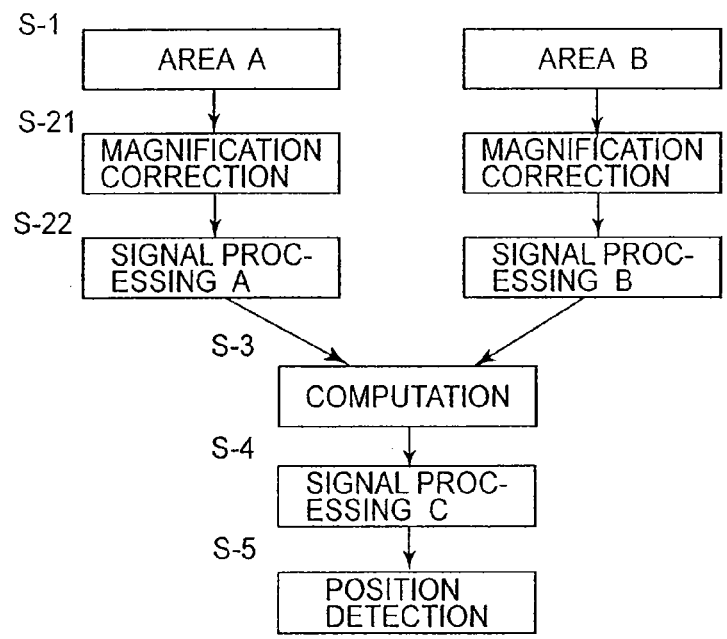

A signal processing method will be described with reference to FIGS. 6A and 6B showing flow charts for illustrating the signal processing method.

FIG. 6A is a flow chart for illustrating the case in which magnification correction is not effected.

Referring to FIG. 6A, images of the first area A and the second area B, which are observed by a single image pickup device, are obtained in step S-1. These two areas may desirably be areas in which images in these areas do not overlap each other, but may also partially overlap each other, as long as the two areas include different portions at which the images are located. It is desirable that the first area A and the second area B have the same size (area). This is because, in many cases, the number of samplings for FFT (fast Fourier transform) analysis in the first area A is equal to that in the second area B.

In the case in which the area of the first area A is different from that of the second area B, such a processing that data at a peripheral portion are extended as they are, so as to cause the first and second areas A and B to have the same area may appropriately be performed.

Next, in Step S-2, signal processing A is effected in the first area A and signal processing B is effected in the second area B. Each of the signal processings A and B is ordinary filtering using a low-pass filter, a high-pass filter, a band-pass filter, an EFT-filter, a smoothing filter, a differential filter, etc. Further, gain adjustment is effected so as to optimize a contrast depending on the reflectances of the mold and the substrate, and the like, factor. Thus, Step S-2 can also be omitted. More specifically, it is also possible to directly perform computation in Step S-3 after image information is obtained from the mutually different areas.

Incidentally, as will be described in the Fourth Embodiment appearing hereafter, it is also preferable, from the viewpoint of an improvement in contrast, that a transmission wavelength range of a filter provided on a light source side or the image pickup device side is changed depending on the gap between the mold and the substrate.

Next, in Step S-3, computation is performed. The computation may be performed by effecting addition of images, multiplication of images, calculation of a difference between images, or calculation of images using other functions.

Next, in Step S-4, signal processing C is performed by using a filter similar to those used in Step S-2.

Finally, in Step S-5, detection of a position is made.

Incidentally, in the case in which image data with respect to the respective areas are obtained by using different image pickup devices, as will be described in Reference Embodiments appearing hereinafter, information about a desired alignment complete condition is obtained in advance by using a standard substrate as a reference substrate.

FIG. 6B is a flow chart showing the case in which Step S-2, in the case shown in FIG. 6A, is divided in Step S-21 for performing magnification correction and Step S-22 for performing signal processing A and signal processing B. Particularly, in the imprint, a height of the mold or the substrate is changed. In correspondence therewith, an optical magnification is also changed. In such a case, there is a possibility that high-accuracy alignment cannot be effected when magnification correction is not made. A method of making the magnification correction may, e.g., be one wherein a distance between adjacent bars is compared with a designed value thereof and a coefficient is changed so that the distance coincides with the designed value. Incidentally, the signal processings in Step S-2 and the subsequent steps may be performed by using two-dimensional data or by converting the two-dimensional data into one-dimensional data.

In this embodiment, the case of using the two (first and second) areas is described, but it is also possible to use three or more areas.

Next, an example of signal processing in the case in which the mold mark shown in FIG. 4A and the substrate mark shown in FIG. 4B are used will be described.

First, in Step S-1, images of the area A and the area B are obtained. In Step S-2, magnification correction and filtering using the smoothing filter in each of the area A and the area B are effected to reduce noise. Further, contrasts of the areas A and B are adjusted. In Step S-3, the images of the areas A and B are adjusted. In Step S-3, the images of the areas A and B after the signal processing are added. This state is similar to that in the case of optical overlaying (superposition). In Step S-4, further signal processing using the smoothing filter, or the like, is effected. In Step S-5, the position is detected.

Incidentally, as the method of signal processing, it is also possible to directly determine centers of gravity of the marks in the areas A and B in Step S-2. Further, in Step S-3, a difference between the centers of gravity is calculated. In Step S-4, the signal processing is not particularly effected. In Step S-5, the difference is converted into a distance between the mold and the substrate. A condition of completion of the alignment is such that the difference is zero. The method described above may also be applicable to this embodiment.

Next, an example of signal processing in the case in which the mold mark having a periodic structure shown in FIG. 4C and the substrate mark having a periodic structure shown in FIG. 4D are used will be described.

First, in Step S-1, images of the areas A and B are obtained. In Step S-2, magnification correction and conversion of two-dimensional data into one-dimensional data by effecting averaging processing are made. Further, by using the FFT filter, components of basic frequency of the periodic structures are obtained. In Step S-3, the resultant values are multiplied schematically. This multiplication is represented by the following equation $$\sin\left(\frac{2\pi}{P_1}x\right) \times \sin\left\{\frac{2\pi}{P_2}(x+\delta)\right\} =$$
$$\int \frac{1}{2}\left[\cos\left\{\frac{2\pi}{P_1}-x+\frac{2\pi}{P_2}(x+\delta)\right\} + \cos\left\{\frac{2\pi}{P_1}-x+\frac{2\pi}{P_2}(x+\delta)\right\}\right]$$

In the above equation, δ represents a positional deviation and the second term of the right side represents a component of moire fringes. In the above equation, for the sake of simplicity, only the case in which the positional deviation δ is added with respect to the period $P_2$ position is shown. Accordingly, it is also possible to add the positional deviation δ with respect to the period $P_1$. Incidentally, in the alignment, it is important that information about relative positional deviation between the two objects be obtained. Further, it is also possible to utilize preliminarily determined known values, without extracting the pitches $P_1$ and $P_2$ from image information, when the components of basic frequency of the periodic structures are obtained.

In Step S-4, by the FFT, it is possible to simply divide the right side into the first term representing a low-frequency component and the second term representing a high-frequency component. As a result, as the component of moire fringes, the following term can be extracted.

$$\cos\left\{2\pi\left(\frac{1}{P_1}-\frac{1}{P_2}\right)x+\frac{2\pi}{P_2}\delta\right\}$$

In Step S-5, the following phase component is extracted.

$$-\frac{2\pi}{P_1}\delta$$

From the phase component, it is possible to detect δ associated with the position.

In the alignment (positional adjustment), a condition of completing the alignment is taken as a time at which the phase component is zero in many cases.

Figure 8:
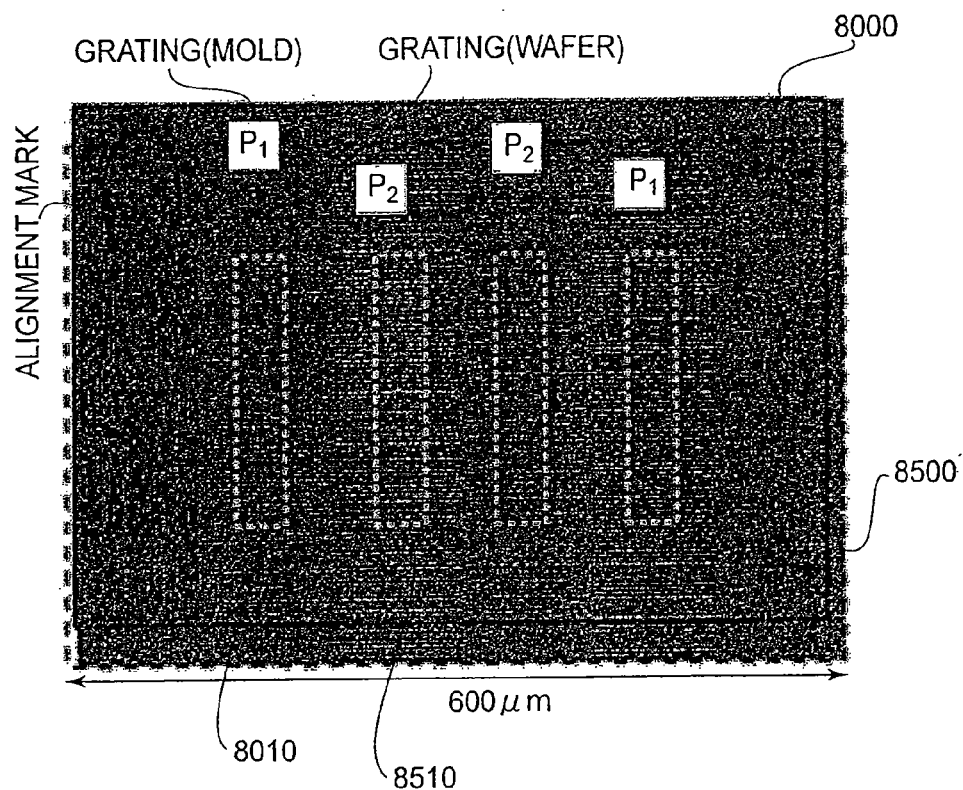
FIG. 8 is a schematic view showing an example of an image in a case in which the alignment marks provided to a mold and a substrate are observed through an image pickup device.
Figure 18A:
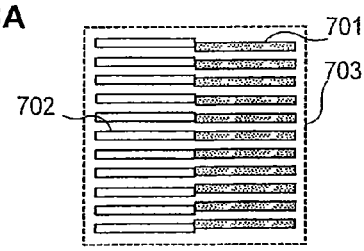
Figure 18B:
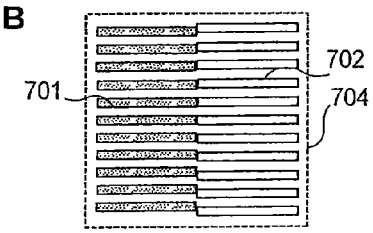

Incidentally, as the grating-type marks, it is possible to use the grating-type marks 703 and 704, shown in FIGS. 18A and 18B, with different pitches. More specifically, these marks are disposed in parallel to each other and from each of basic frequencies of the gratings, two sets of moire fringes with the same pitch are generated. By using these moire fringes, it is also possible to effect the alignment between the mold and the substrate. In this case, marks with pitches $P_1$ and $P_2$ are disposed on the substrate so as not to overlap each other, and marks with pitches $P_1$ and $P_2$ are disposed on the mold so as not to overlap each other. It is preferable that two sets of moire fringes are generated by a combination of the substrate-side grating with pitch $P_1$ and the mold-side grating with pitch $P_2$ and a combination of mold-side grating with pitch $P_1$ and the substrate-side grating with pitch $P_2$, as shown in FIG. 8. The biggest advantage of such generation of the two sets of moire fringes is that it is possible to cancel relative displacement between an image pickup object and the image pickup device. The generation of the two sets of moire fringes is also preferable in such a respect that the displacement is doubled in value.

Incidentally, as is understood from the above equation, the phase component is proportional to the displacement. Accordingly, it is possible to linearly measure a positional displacement between the mold and the substrate. This results in that it is generally possible to linearly measure a relative positional displacement between two planes. The present invention (according to the above-described sixth aspect) also includes measurement with respect to such positions of two objects (e.g., measurement of an amount of relative movement in the in-plane direction or measurement of the respective positions themselves).

Examples of application of the position measurement method may include a linear scale for measuring a position of a stage.

Incidentally, an ordinary box-in-box type alignment mark is constituted so as to have a high sensitivity at a zero point. Accordingly, as the mark for use in the position measurement method described above, the above-described grating-type alignment mark is suitable for the linear measurement. Further, the two objects employed in the measurement method generally include a plate-like object. However, the two objects are not particularly limited to the plate-like objects, as long as it is provided with the above-described alignment mark. For example, the two objects may be a combination of an object having a curved surface and a plate-like object.

Further, in this embodiment, the moire fringes are generated by the combination of two-gratings, but may also be generated by numerically multiplying the image pickup result of the alignment mark 701 with pitch $P_1$ by a sine wave with pitch $P_2$. Further, it is also preferable that the image pickup result of the alignment mark 701 with pitch $P_2$ is multiplied by a sine wave with pitch $P_2$ and a constant component is extracted with a filter to detect a phase.

Incidentally, an essential difference between the overlaying (superposition) of patterns, such as a grating pattern, or the like, in the signal processing described in this embodiment and optical overlaying (superposition) will be described below.

The former (signal processing) overlaying is an ideal state, but the latter (optical) overlaying is adversely affected by multiple reflection, or the like. Particularly, in the case in which the mold and the substrate have different reflectances, the optical overlaying is adversely affected by the multiple reflection. Accordingly, depending on a detection algorithm, an error can occur in measurement in the case in which the two marks are actually overlaid optically. For this reason, as in the present invention, it is possible to obtain ideal signals to reduce an occurrence of error by using mutually non-overlapping areas when the areas are observed from the perpendicular direction.

In this embodiment, at the time when components of basic frequencies of the first and second periodic structures extracted through the FFT filter from the image data corresponding to the first and second periodic structures, it is possible to determine an amount $\delta$ of positional deviation between the mold and the substrate. Accordingly, it is also possible to effect positional adjustment without further performing the computation (S-3 shown in FIGS. 6A and 6B).

Further, it is also possible to extract information about relative positional deviation between the mold and the substrate without extracting the components of basic frequency of the periodic structures from the image information obtained by the image pickup device, i.e., by inputting the basic frequencies themselves as preliminarily determined information. The multiplication in Step S-3 is performed by using two sine functions, but may also be performed by utilizing cosine functions or other functions.

Herein, below, the case in which the alignment method of this embodiment is applied to an imprint apparatus will be described with reference to FIGS. 7 to 11.

Figure 7:
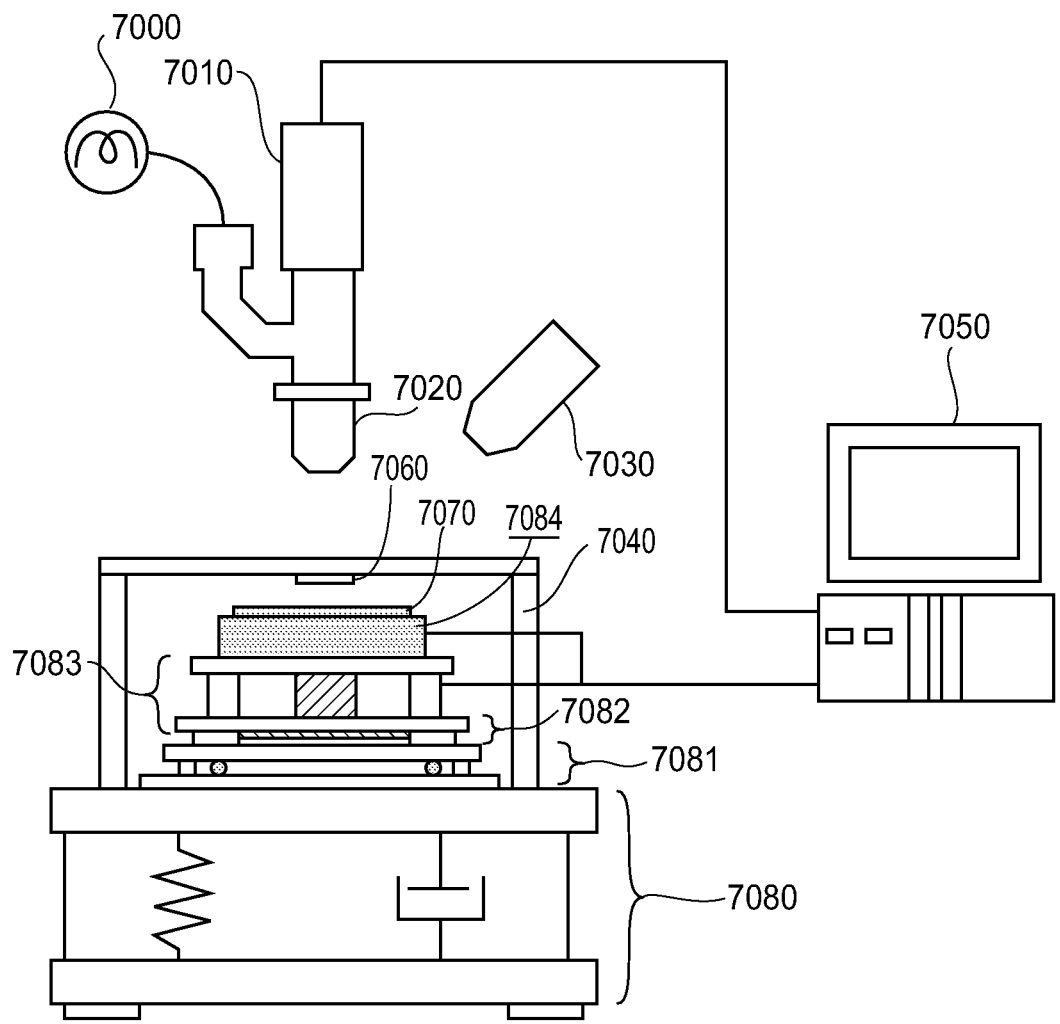
FIG. 7 is a schematic view showing an embodiment of a constitution of an imprint apparatus for carrying out an imprint method according to the present invention.

FIG. 7 is a schematic view for illustrating the imprint apparatus.

The imprint apparatus includes a light source 7000 (halogen lamp), an image pickup device 7010 (CCD: 1.3 megapixels; twelve bit), a lens 7020 (magnification: 10; numerical aperture (NA): 0.28), and an ultraviolet (UV) light source 7030 for curing a photocurable resin material. The UV light source is inclined with respect to an optical axis of the lens 7020.

The imprint apparatus further includes a housing 7040 for holding a mold, a mold 7060 provided with an imprint pattern, a wafer substrate 7070 formed of silicon, or the like, a vibration isolation table 7080, and a group of stages 7081, 7082, and 7083, which are operable in a perpendicular direction, respectively, in order to effect coarse adjustment. These stages have alignment accuracies of ±1 μm or less with respect to the XYZ directions and an accuracy of ±1 m degree or less with respect to the θ (a rotation angle about an axis direction). The imprint apparatus further includes a fine adjustment stage 7084 utilizing a piezoelectric element.

In the imprint apparatus, it is possible to effect alignment adjustment with an accuracy of 1 nm or less in a range of 200 μm in each of XYZ directions. Further, ranges with respect to α (a rotation axis about the x-axis) and β (a rotation axis about the y-axis) are ±1000 grad or less, and a range of θ is ±800 μrad.

The imprint apparatus further includes a computer 7050 for performing signal processing and sending control signals.

The mold 7060 is formed of quartz and provided in advance with a rectangular or cross alignment mark and a grating with pitch $P_1$. The mold has a 50 nm-thick surface layer of SiN. The alignment mark has grooves having a depth of 166 nm. The substrate 7070 formed of a silicon wafer is provided with an alignment mark and a grating with pitch $P_2$. The alignment mark for the substrate has grooves having a depth of 150 nm.

FIG. 8 shows a state in which a mold-side alignment mark 8000 (enclosed by a solid line) and a substrate-side alignment mark 8500 (enclosed by a dotted line) observed through an image pickup device overlap each other. As described above, in FIG. 8, the mold is also provided with the grating with pitch $P_2$. Further, the substrate is also provided with the grating with pitch $P_1$. The gratings with pitches $P_1$ and $P_2$ provided on each of the substrate and the mold are disposed so as not to optically overlap each other. Further, at mutually non-overlapping positions, a first area (region) 8010 and a second area (region) 8510 are determined. In FIG. 8, a resist as the photocurable resin is interposed between the mold and the substrate.

Figure 9A:
FIGS. 9A to 9B are schematic views showing grating images in two areas.
Figure 9B:
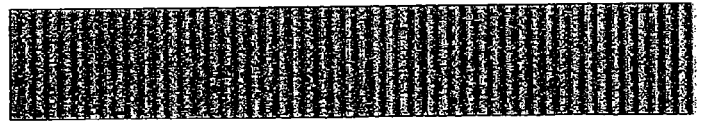

FIG. 9A shows the first area 8010 extracted from the image data in FIG. 8, and FIG. 9B shows the second area 8050 extracted from the image data in FIG. 8.

Figure 10:
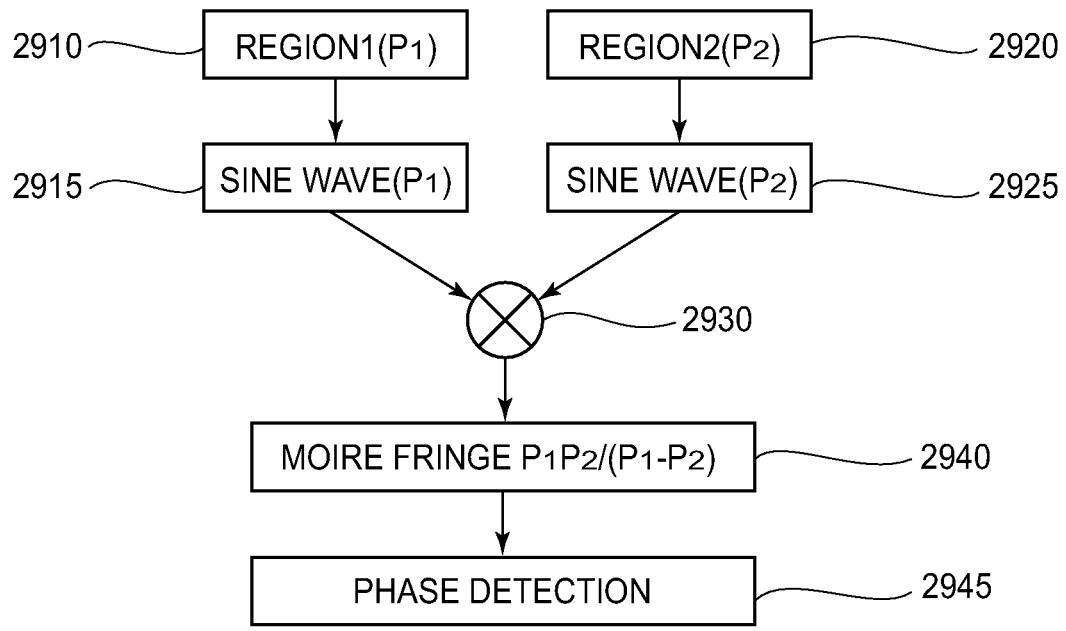
FIG. 10 is a schematic view for illustrating an embodiment of signal processing in the present invention.

With reference to FIG. 10, signal processing will be specifically described.

First, image data are selected and extracted from the first and second areas (Steps 2910 and 2920 in FIG. 10).

On the basis of these image data, basic frequency components of periodic structures are extracted as sine waves with an FFT (fast Fourier transform) filter after magnification correction and conversion of two-dimensional data into one-dimensional data are made as desired (Steps 2915 and 2925). These sine waves are mathematically multiplied as described above (Step 2930). Incidentally, in the above-described equation, the positional deviation δ is represented by an equation attributable to the positions on the substrate side. In other words, the equation is used for performing the signal processing on the presumption that the mold-side positions are located at desired positions. The computation may also be performed on the presumption that the substrate-side positions are located at desired positions. It is also possible to perform the computation using both of positional deviations d1 and d2 attributable to the positions on the mold side and the substrate side, respectively.

By the computation (Step 2930), it is possible to obtain a component of moire fringes represented by the following term (Step 2940).

$$\cos\left\{2\pi\left(\frac{1}{P_1}\ \frac{1}{P_2}\right)x\frac{2\pi}{P_2}\delta\right\}$$

Figure 11:
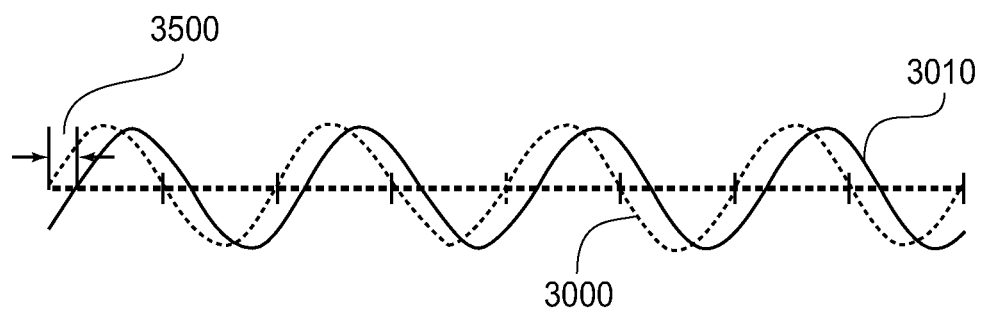
FIG. 11 is a schematic view for illustrating phase deviation.

From this term, a phase component $(-(2\pi/P_2)\delta$ is extracted. FIG. 11 shows profiles of the moire fringe component, wherein a dotted line 3000 represents the case in which there is no out-of-phase component, and a solid line 3010 represents the case in which the moire fringe component is actually deviated by the above-described phase component 3500.

It is possible to effect positional adjustment (alignment) by moving the substrate relative to the mold so as to cancel the phase component deviation.

Incidentally, in the case in which the substrate and the mold are deviated from desired positions by a degree equal to or more than the period of the moire fringes, a magnitude of actual phase deviation cannot be accurately determined in some cases. In these cases, it is preferable that coarse adjustment with the cross or rectangular mark provided close to the grating is initially performed and, thereafter, fine adjustment with the grating is performed to detect the above-described magnitude of the phase deviation. The fine adjustment is not necessarily performed by using the alignment mark shown in FIG. 8, but may also be performed by appropriately employing a known method.

Fourth Embodiment

An imprint method according to this embodiment relates to an imprint method in which a pattern formed on a processing surface of the mold is transferred by curing a resin material disposed on the surface of the substrate.

The imprint method is characterized in that when an alignment mark provided to the mold is observed through the image pickup device, a wavelength of light entering the image pickup device is controlled depending on the gap between the mold and the substrate or a thickness of a member constituting the alignment mark. More specifically, in the imprint method, the resin material onto which the pattern is to be transferred is interposed between the mold and the substrate. In the case where the refractive indices of the resin material and the mold are close to each other, a phenomenon occurs, which is called index matching such that the alignment mark, including projections and recesses formed on the mold, are caused to disappear. In an actual observation, it is difficult to perform the observation of the alignment mark for the mold.

In order to obviate the index matching by which the mold mark disappears, it is effective to use a mark formed of a high-refractive index material.

However, in the imprint method, the gap between the mold and the substrate can be several tens of nanometers to several hundreds of nanometers. In such a case, the contrast of the mark can be lowered by an interference effect of light, thus being required to be further improved.

The reason why the use of the high-refractive index material for the mold for imprint (particularly, at the alignment mark portion) is preferable, will be described.

Assuming that the mold mark is constituted by $SiO_2$ having a refractive index of 1.45, resin materials having a refractive index of 1.5, and SiN having a refractive index of 2.0, a reflectance R at an interface between materials having refractive indices $n_1$ and $n_2$ is represented by the following equation.

$$R = \left(\frac{n_1 - n_2}{n_1 + n_2}\right)^2$$

Accordingly, a reflectance R at an interface between $SiO_2$ and the resin material is:

$R=2.9\times10^{-4}$.

This value is very small. When the mark is observed, the mark is less observable due to the above-described index matching.

On the other hand, a reflectance R at an interface between SiN and the resin material is:

$R=2.0\times10^{-2}$.

This value is larger than that at the interface between $SiO_2$ and the resin material by about two digits. Here, a reflectance R at an interface between $SiO_2$ and air is:

$R=3.4\times10^{-2}$.

As described above, it is found that the reflectance is largely improved by using SiN as the material for the mold mark.

Incidentally, in the imprint method, the gap between the mold and the substrate and the thickness of the film of the high-refractive index material can be several tens of nanometers to several hundreds of nanometers. In such a case, the light interference effect is remarkably obtained.

Figure 19:
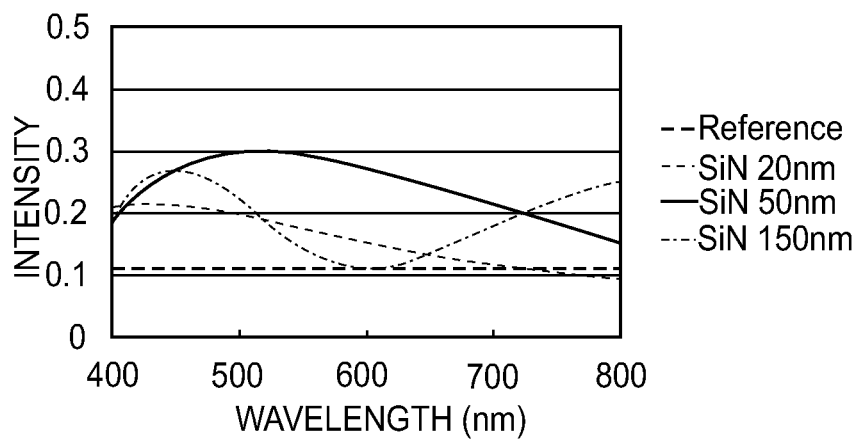
FIGS. 19 and 20 are graphs, each showing a relationship between a wavelength and an intensity of light entering an image pickup portion.

FIG. 19 is a graph showing a relationship between a wavelength and a reflected light intensity in the case in which the mold mark has a four-layer structure including layers of $SiO_2$, SiN, a resin material (thickness (gap): 100 nm), and Si, and a thickness of the SiN layer is variable. More specifically, FIG. 19 shows a result of simulation with the four-layer structure, including an Si layer having an infinite thickness, a 100 nm-thick resin material layer formed on the Si layer, an SiN layer (thickness: 20 nm, 50 nm, 150 nm) formed on the resin material layer, and an $SiO_2$ layer, which has an infinite thickness and is disposed on the SiN layer.

Calculation of values is made by using a model for Fresnel reflection. As a reference, a three-layer structure including three layers ($SiO_2$ layer/resin material layer/Si layer) prepared by omitting the SiN layer from the above-described four-layer structure is employed.

A resultant contrast when the mark is observed is better with a larger difference between the four-layer structure, including the SiN layer and the three-layer (reference) structure lacking the SiN layer.

For example, at the wavelength of 600 nm, a reflected light intensity is 0.27 when the SiN layer has a thickness of 50 nm and is 0.11 when the SiN layer has a thickness of 150 nm. The reference structure provides a reflected light intensity of 0.11 at the wavelengths of 400-800 nm, so that a contrast at the wavelength of 600 nm is increased in the order of the SiN layer thickness of 150 nm, 20 nm, and 50 nm. At the wavelength of 800 nm, a contrast is increased on the order of 20 nm, 50 nm, and 150 nm (SiN layer thickness). Further, at the wavelength of 400 nm, a contrast is highest at the SiN layer thickness of 20 nm.

Figure 20:
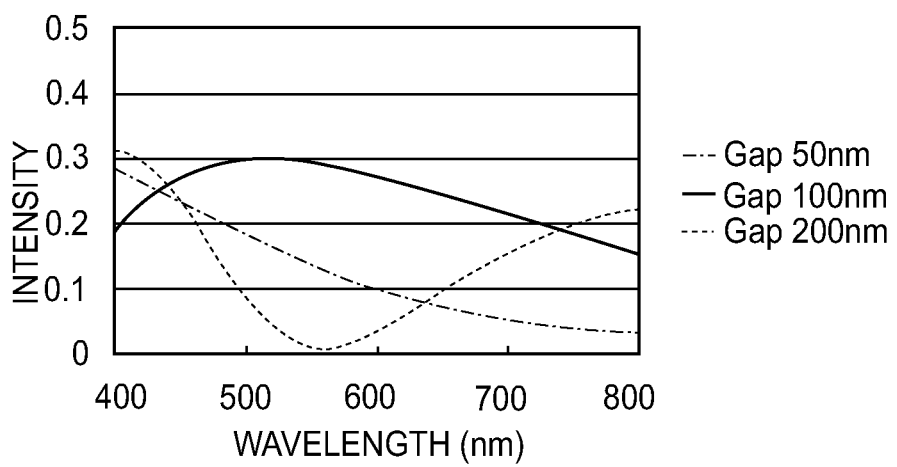

FIG. 20 is a graph showing a relationship between a wavelength and a reflected light intensity in the case in which the mold mark has a four-layer structure including layers of $SiO_2$, SiN (thickness: 50 nm), a resin material, and Si, and a thickness of the resin material layer as a gap layer is variable. More specifically, values of the thickness (gap) are 50 nm, 100 nm, and 200 nm.

When the reflected light intensities at the wavelength of 600 nm are compared, the intensity values are 0.273 for the gap (resin material layer thickness) of 100 nm, 0.099 for the gap of 50 nm, and 0.033 for the gap of 200 nm. Since the intensity of the reference structure is 01.11 at the wavelengths of 400-800 nm (FIG. 19), a contrast at the wavelength of 600 nm is increased in the order of the gaps of 50 nm, 200 nm, and 100 nm. A contrast at the wavelength of 500 nm is increased in the order of the gaps of 200 nm, 50 nm, and 100 nm. Further, a contrast at the wavelength of 800 nm is increased in the order of the gaps of 100 nm, 50 nm and 200 nm.

As described above, the reflectance is changed depending on the wavelength in the case where the SiN layer thickness or the gap (resin material layer thickness) is several tens of nanometers to several hundreds of nanometers (a fraction of the wavelength of light for observation to several times the wavelength of light for observation). For this reason, it is desirable that the wavelength of light entering the image pickup device is controlled, depending on the SiN layer thickness or the gap.

Incidentally, when spectra of light entering the image pickup device are in a range of 400-800 nm, a contrast is determined by a difference between an average of the spectral in this range and the reference (intensity: 0.11).

Next, an alignment method will be described.

In the alignment, accuracy of alignment is improved with an increase in contrast of the mold mark. An observation wavelength of the mark, in the case in which alignment is effected while bringing the mold and the substrate near to each other, will be described. The SiN layer has a thickness of 50 nm in this case. When the gap is 200 nm, the mark is observed at the wavelength of 400-450 nm. When the gap is 100 nm is a further approximated state, the mark is observed at the wavelength of 500-550 nm. When the gap is 50 nm in a still further approximated state, the mark is observed at the wavelength of 400-450 nm. Even when the gap is another value, the mark is observed at an optimum wavelength.

A method of selecting the wavelength may be a method using a color filter or a method using a plurality of laser beams. The color filter may be disposed on the illumination optical system side or the image pickup device side.

In a preferred embodiment of the present invention, the above-described constitutions of this embodiment are incorporated into those described in the First to Third Embodiments.

For example, in the above-described First to Third Embodiments, in the case in which optical information is inputted into the image pickup device through a wavelength filter, it is possible to always obtain information about an image having a high contrast by changing a transmission wavelength range of the wavelength filter depending on the gap. Further, in an imprint apparatus for transferring a pattern formed on a processing surface of a mold by curing a resin material in a substrate surface, it is preferable that the apparatus includes an image pickup device for observing the mold and a means for controlling a wavelength of light entering the image pickup device depending on a gap between the mold and the substrate. The means for controlling the wavelength is constituted by the color filter or a plurality of light sources (capable of outputting light fluxes at a plurality of wavelengths).

Other Embodiments

In the present invention, it is possible to employ the following constitutions.

More specifically, it is possible to employ a constitution in which an optical system for observing a first object position at a processing surface of the mold and a second object position at a portion closer than the processing surface, to a member to be processed is used, and alignment between the mold and the member to be processed is effected by using a means for recognizing a relative relationship of (or a difference in) observation position between a first image pickup device for observing the first object position and a second image pickup device for observing the third object position. In this case, it is possible to employ a constitution in which the reference substrate is used as the means for recognizing the difference in observation position. Further, it is possible to employ a constitution in which the alignment between the mold and the member to be processed is effected by comparing data obtained in advance by the first and second image pickup devices with data (currently) obtained by the first and second image pickup devices. Further, it is also possible to employ a constitution in which the alignment between the mold and the member to be processed is effected by making a comparison in each of several areas in image pickup areas of the first and second image pickup devices.

Further, in order to realize a processing method by the above-described pattern transfer, it is possible to employ the following constitutions.

In the processing method, an optical system for observing a first object position at a processing surface of the mold and a second object position at a portion closer to the member to be processed, with respect to the processing surface of the mold, is used. The processing method can be constituted so that the alignment between the mold and the member to be processed is effected by using a means for recognizing a relative relationship of (or a difference in) observation position between a first image pickup device for observing the first object position and a second image pickup device for observing the second object position. In this case, it is possible to employ a constitution in which the reference substrate is used as the means for recognizing the difference in observation position. Further, it is possible to employ a constitution in which the processing method includes a step of recognizing the difference in observation position by the reference substrate and a step of effecting the alignment between the member to be processed and the mold at the second object position. Further, it is possible to employ a constitution in which the alignment between the mold and the member to be processed is effected by comparing data obtained in advance by the first and second image pickup devices with data (currently) obtained by the first and second image pickup devices. Further, it is possible to employ a constitution in which the processing method includes a step of selecting a plurality of areas from an image obtained by the first image pickup device, a step of effecting first signal processing in each of the plurality of areas, and a step of effecting second signal processing on the basis of a result of the first signal processing. Further, it is possible to employ a constitution in which the data obtained by the first and second image pickup devices by using gratings having different pitches as marks for the alignment described above are overlaid or superposed, and subjected to signal processing to generate moire fringes and the generated moire fringes are utilized.

In the above-described embodiments of the present invention, a relative positional relationship between the respective image pickup ranges at two (first and second) object positions is measured or determined with the reference substrate by using the optical system for observing coaxially the two object positions of the mold and the substrate. By utilizing a result of the measurement, it is possible to effect the alignment between the mold and the substrate. As a result, the alignment can be effected in a separation state between the mold and the substrate, so that it is possible to effect the alignment between the mold and the substrate without image to the mold and the substrate. Further, by disposing the marks for the mold and the substrate in different areas as seen in a normal direction, interference between the marks for the mold and the substrate does not occur. As a result, the signal processing becomes easy.

Further, the pattern transfer apparatus according to the present invention can also be constituted as described below. Herein, the apparatus means a pattern transfer apparatus for transferring the imprinting pattern formed on the mold onto the substrate or the resin material interposed between the substrate and the mold. The pattern transfer apparatus includes a first image pickup portion for obtaining an image a first depth of focus and a second image pickup portion for obtaining an image at a second depth of focus. A first alignment mark provided to the mold and a second alignment mark provided to the substrate are disposed within the first depth of focus and observed through the first image pickup portion to obtain a first image. Further, a third mark provided to the mold or the substrate is disposed within the second depth of focus and observed through the second image pickup portion to obtain a second image. The pattern transfer apparatus is constituted so as to obtain information about a difference in observation range between the first and second image pickup portions by using the first and second images. The third alignment mark may be identical to or different from the first alignment mark or the second alignment mark.

Further, it is also possible to effect the alignment between the mark and the substrate (onto which the imprinting pattern is to be transferred) in an in-plane direction in a state in which the alignment mark for the mold is disposed within the first depth of focus and the alignment mark for the substrate is disposed within the second depth of focus. It is further possible to effect the alignment between the mold and the substrate in the in-plane direction in a state in which the alignment mark for the mold is disposed within the second depth of focus and the alignment mark for the substrate is disposed within the first depth of focus.

REFERENCE EMBODIMENTS

Herein, below, several reference embodiments applicable to the present invention will be described with reference to the drawings.

Reference Embodiment 1

In Reference Embodiment 1, an alignment method of the mold and the substrate in the present invention will be described.

FIGS. 12A to 12D are schematic views for illustrating the alignment method, in this reference embodiment, of the old and the substrate in which the reference substrate is used.

Referring to FIGS. 12A to 12D, a reference numeral 101 represents a first object position, reference numeral 102 represents a second object position, reference numeral 103 represents a mold, and reference numeral 104 represents a mold mark. Further, reference numeral 110 represents a reference substrate, reference numeral 111 represents a reference substrate mark, reference numeral 112 represents a substrate, and reference numeral 113 represents a substrate mark.

In the alignment method of this reference embodiment, an optical system for observing the first object position 101 at a processing surface of the mold 103 and the second object position 102 located in the substrate 112 side with respect to the processing surface is used. By the optical system, the mold mark 104 and the substrate mark 113 are observable at the same time.

The first object position and the second object position are spaced, e.g., several nanometers or more apart, so that the mold and the substrate are in a non-contact positional relationship even when the substrate is moved at a high speed in an in-plane direction parallel to the processing surface.

In each of FIGS. 12A to 12D, a central view shows a first observation range 106 at the first object position 101. Further, a right-hand view shows a second observation range 107 at the third object position 102. The first observation range 106 includes a first image pickup range 108 as a portion for image pickup, and the second observation range 107 includes a second image pickup range 109 as a portion for image pickup. Further, a left-hand view shows a cross section, of the mold 103 and the reference substrate 110 or the substrate 112, taken along a vertical bisecting line, such as A-A' line indicated in the central view of FIG. 12A.

Generally, it is not easy to dispose coaxially the image pickup device for observing these two (first and second) object positions with an accuracy on the order of nanometers, so that a difference in a center position between the first observation range and the second observation range is caused to occur. Further, a difference in a center position between each observation range and an associated image pickup range is also caused to occur. In addition, there is a difference in a center position between the first observation range and the mold mark. Objects to be finally aligned with each other are the mold and the substrate, so that the center of the substrate mark is aligned with the center of the mold mark in this reference embodiment. For simplicity of explanation, it is assumed that the first observation range and the first image pickup range coincide with each other and the second observation range and the second image pickup range coincide with each other. Even when this assumption is made, generality of explanation is not lost. Further, for simplicity of explanation, it is assumed that the center positions of the first observation range and the second observation range are deviated only in the y-direction. A direction from the second object position toward the first object position is taken as a positive direction of the z-direction.

The alignment method of this reference embodiment will be briefly described. In the alignment method, the reference substrate 110 is used for the alignment between the mold and the substrate.

A procedure of the alignment method is as follows.

Figure 12A:
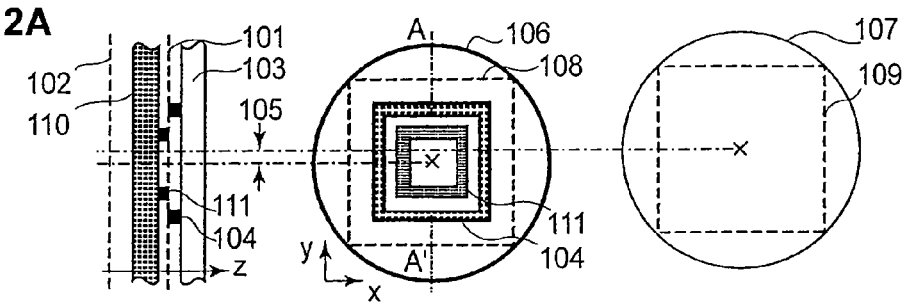
FIGS. 12A to 12D are schematic views for illustrating a method of alignment between a mold and a substrate by means of a reference substrate in Reference Embodiment 1 of the present invention, wherein FIG. 12A includes views for illustrating a case in which observation is made in a state in which the reference substrate is disposed at a first object position, FIG. 12B includes views for illustrating a case in which observation is made in a state in which the reference substrate is disposed at a second object position, FIG. 12C includes views for illustrating a case in which observation is made in a state in which the substrate is disposed at the second object position, and FIG. 12D includes views for illustrating a case in which observation is made in a state in which the substrate is disposed at the first object position.

(1) The mold and the reference substrate are aligned at the first object position by using an in-plane moving mechanism (FIG. 12A).

Figure 12B:
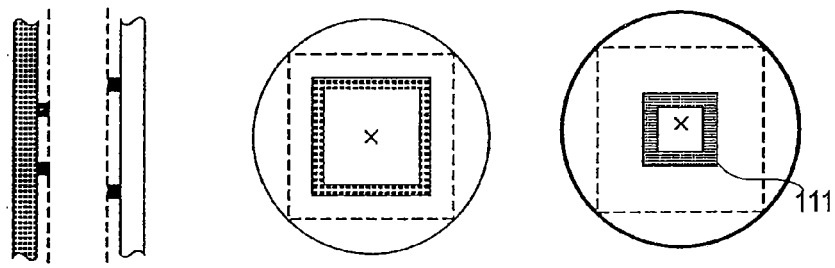

(2) The reference substrate is moved in a negative direction of the z-direction and an image thereof is constituted and obtained at the second object position (FIG. 12B).

Figure 12C:
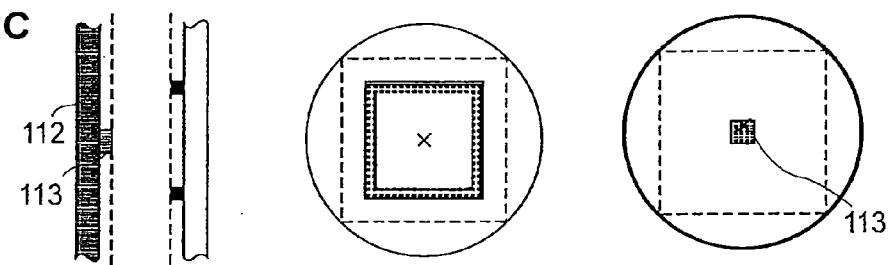

(3) At the second object position, the observed image and the substrate are aligned by using the in-plane moving mechanism (FIG. 12C).

Figure 12D:
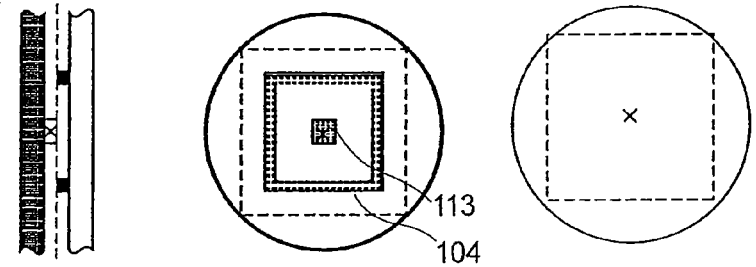

(4) Only by moving the substrate in the positive direction of the z-direction, the substrate is aligned with the mold at the first object position (FIG. 12D).

In such a step-and-repeat method that a predetermined pattern is repetitively transferred at many points on the same substrate, alignment may be effected only at a first point on the substrate. Thereafter, it is possible to effect repetitive transfer with an accuracy of the in-plane moving mechanism (on the order of sub-nanometers).

Next, a detailed description will be made.

In order to align the substrate mark with a desired position at the first object position, it is necessary to determine a position, at which the substrate mark should be disposed at the second object position, corresponding to the desired position at the first object position. This operation is, e.g., performed only during replacement of the mold. FIG. 12A shows a state in which the reference substrate mark 111 is caused to correspond to the mold mark at the first object position 101. This state is realized in the following manner. On the assumption that the mold mark 104 is located at the center of the first image pickup range, the substrate is disposed at a substrate holding portion and the center of the reference substrate mark 111 can be caused to correspond to (the center of) the mold mark 104 by using the in-plane moving mechanism. The alignment (positional adjustment) at this time can be effected with an accuracy on the order of nanometers by using the in-plane moving mechanism. During the alignment, the image at the second object position 102 is not particularly required to be used.

Next, as shown in FIG. 12B, the reference substrate is moved in the negative direction of the z-direction by using a substrate hoisting and lowering mechanism so that the reference substrate mark 111 reaches the second object position 102. During this movement, the reference substrate is not deviated in the xy-directions. In the resultant state, the reference substrate mark 111 is observed at the second object position 102 and an image in this state is picked up and stored. At this time, the image at the first object position 101 is not particularly required to be used.

Next, with reference to FIGS. 12C and 12D, the method of the alignment between the mold and the substrate will be described. This operation is performed for every disposition (or placement) of a fresh substrate.

As shown in FIG. 12C, the substrate holding portion holding the substrate 112 is disposed at a designated position (referred to as "F1-1") opposite to the mold 103 by the in-plane moving mechanism. At this time, the substrate mark 113 is observed at the second object position 102. Then, alignment is effected so that the center of the substrate mark 113 is aligned with the center of the reference substrate mark 111 observed at the second object position 102, shown in FIG. 12B, by using the in-plane moving mechanism. This alignment can be effected at a high speed, since the mold and the substrate are placed in a separate state. A difference (referred to as "E1-1") between the designated position (F1-1) of the substrate holding portion at this time and a designated position of the substrate holding portion after completion of the alignment (referred to as "S1-1") is stored. In this case, it is not particularly necessary to use the image at the first object position 101.

Next, as shown in FIG. 12D, the substrate 112 is raised in the positive direction of the z-direction, so that the substrate 112 is disposed at the first object position 101. At this time, the mold and the substrate is basically placed in a completion state of alignment. Thereafter, imprint is effected by setting a designated position on the presumption that there is the difference (deviation) (E1-1) with respect to subsequent transfer onto the same substrate. In this case, it is not particularly necessary to use the image at the second object position 102.

In the case in which the mold and the substrate are deviated from each other and located outside a tolerable range, it is also possible to effect further alignment between the mold and the substrate. This operation may be required, e.g., in the case in which the positions of the mold and the substrate are deviated from each other due to a stress, exerted thereon, caused by the contact between the mold and the substrate via the resin material. In the case in which the positional deviation between the mold and the substrate occurs, when an amount of the deviation between the mold and the substrate is identical, irrespective of the position of the substrate, the following processing is performed. More specifically, a difference (referred to as "E1-2") between the designated position (F1-1) of the substrate holding portion at that time and a position of the substrate holding portion at the time of completion of the alignment (referred to as "S1-2") is stored. In this case, the alignment has already been effected at the second object position, as shown in FIG. 1C, so that a value of the difference (E1-2) is not large. Thereafter, imprint is effected by setting a designated position on the presumption that there is the difference (deviation) (E1-2) with respect to subsequent transfer onto the same substrate.

The above-described alignment is effected on the entire surface of the substrate on the basis of information about the positional deviation between the mold and the substrate at a certain point of the substrate. However, it is also possible to effect the alignment between the mold and the substrate on the basis of information about positional deviation, at the entire surface of the substrate, obtained in advance of the alignment.

Figure 13A:
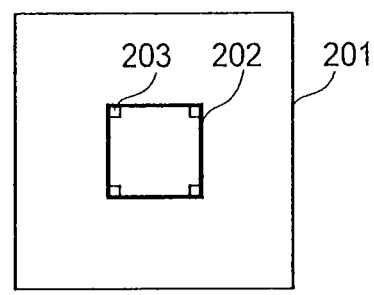
FIGS. 13A to 13C are schematic views for illustrating a constitution of the reference substrate in Reference Embodiment 1.
Figure 13B:
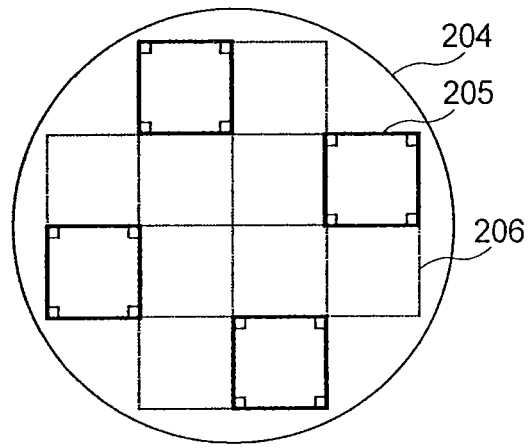
Figure 13C:
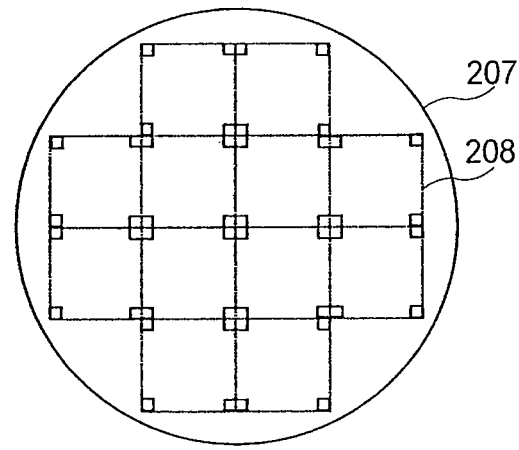

Next, a constitution of the reference substrate used in this reference embodiment will be described with reference to FIGS. 13A to 13C showing the constitution of the reference substrate.

As the reference substrate, it is also possible to use the substrate itself, onto which the imprinting pattern is to be transferred. However, in this case, there is apprehension that distortion of the substrate during the process and a difference among individual substrates can occur. For this reason, it is desirable that a stable reference substrate is used.

A reference substrate 201, shown in FIG. 13A, has a square shape and is constituted so that an area 202, having a size equal to a pattern area of the mold, is disposed on the reference substrate 201 and four reference substrate marks 203 are disposed at four corners of the area 202.

A reference substrate 204, shown in FIG. 13B, has a circular shape and is constituted so as to have a size equal to that of the substrate, onto which the imprinting pattern is to be transferred. On the reference substrate 204, there are a pattern area 205, in which reference substrate marks are provided, and a pattern area 206, in which no reference substrate mark is provided. In this constitution, correction of the positional deviation can be made at several positions at which the reference substrate mark is provided.

A reference substrate 207, shown in FIG. 13C, is constituted by the substrate itself, onto which the imprinting pattern is to be transferred. In this case, the correction may be made at all of the positions in pattern areas or at the several positions shown in FIG. 13B.

Figure 14:
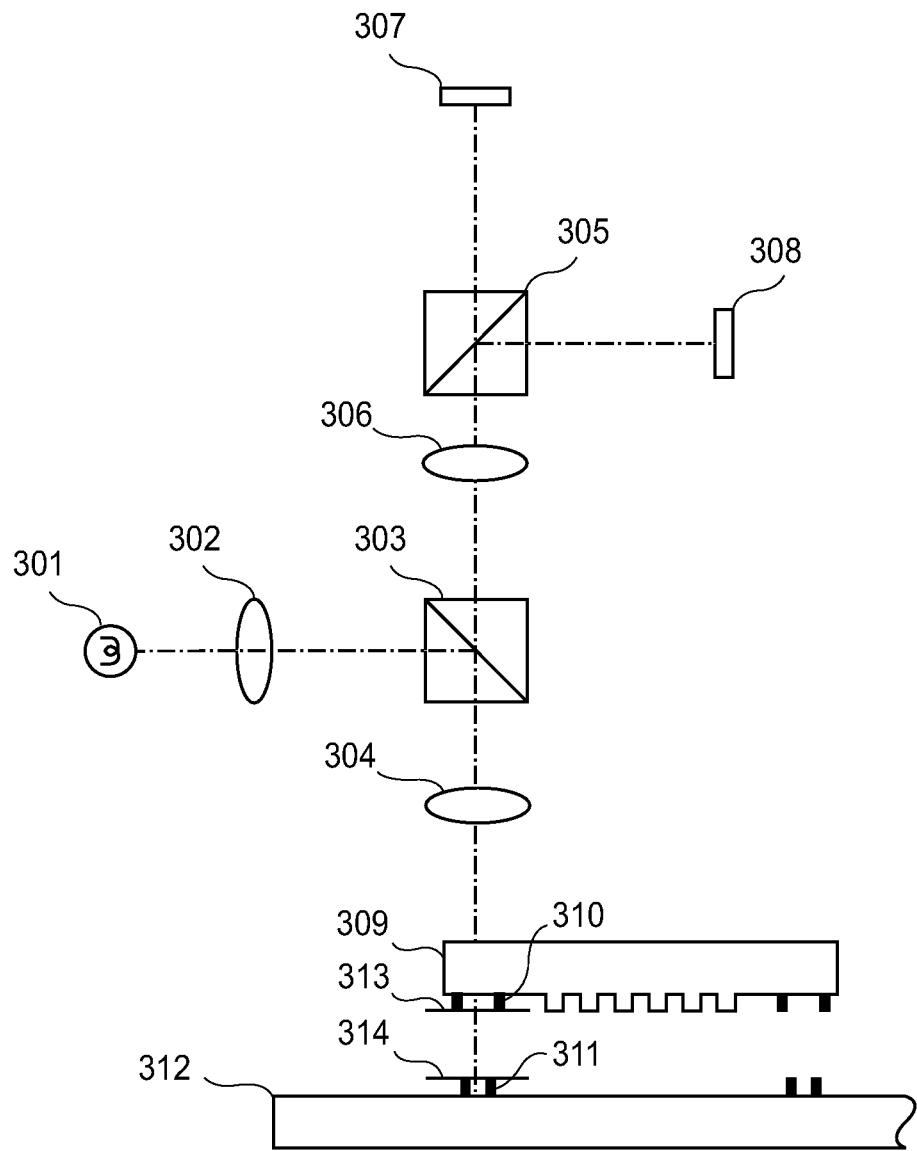
FIG. 14 is a schematic view for illustrating a measuring optical system in Reference Embodiment 1.

Next, an optical system for measurement used in this reference embodiment will be described with reference to FIG. 14 showing a constitution of the optical system.

In the optical system in this reference embodiment, light emitted from a light source 301 passes through an illumination optical system 302, a first beam splitter 303, and a first imaging optical system 304 to reach a mold 309, and the substrate 312 passes through the first image optical system 304, the first beam splitter 303, a second imaging optical system 306, and a second beam splitter 305 to form an image on a first image pickup device 307 and a second image pickup device 308. In this reference embodiment, a mold mark 310 is formed as an image on the first image pickup device 307 and an image of the second object position 314 is formed on the second image pickup device 308.

Figure 15:
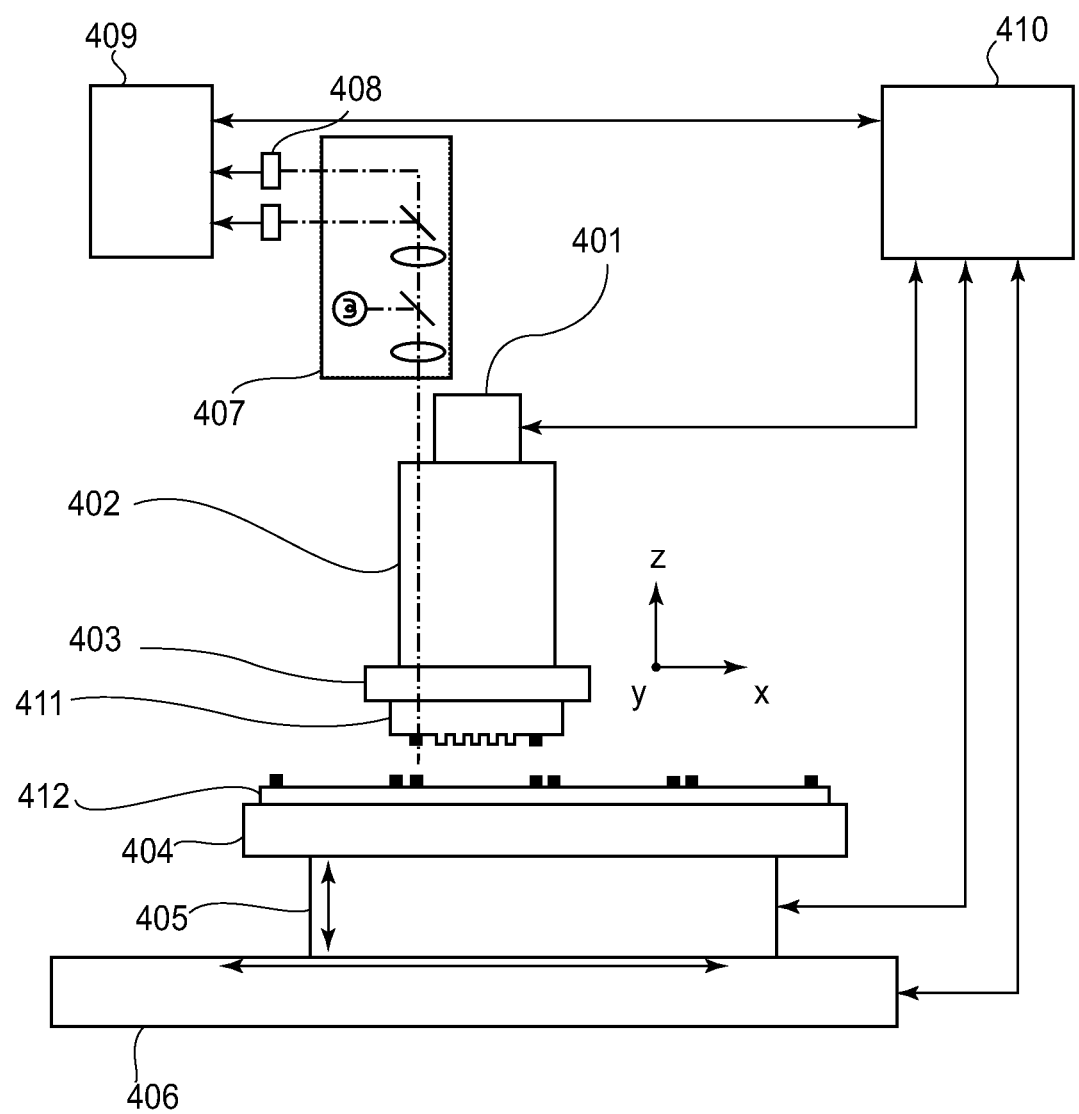
FIG. 15 is a schematic view for illustrating a processing apparatus in Reference Embodiment 1.

Next, a processing apparatus, used in this reference embodiment, constituting a pattern transfer apparatus for transferring an imprinting pattern formed on a mold onto a substrate or a resin material interposed between the substrate and the mold will be described with reference to FIG. 15, showing an example of a constitution of the processing apparatus in Reference Embodiment 1.

Referring to FIG. 15, the processing apparatus includes an exposure light source 401, a body tube 402, a mold holding portion 403, a substrate holding portion 404, a substrate hoisting and lowering mechanism (z-direction) 405, an in-plane moving mechanism (xy-directions) 406, the optical system for measurement shown in FIG. 14, image pickup devices 408, and an analyzing mechanism 409.

The mold holding portion 403 effects chucking of a mold 411 according to a vacuum chucking method, or the like. A substrate 412 is movable to a desired position by the in-plane moving mechanism 406. Further, by the substrate hoisting and lowering mechanism 405, adjustment of a height of the substrate 412 and application of pressure can be effected. The in-plane moving mechanism 406 and the substrate hoisting and lowering mechanism 405 are subjected to measurement of distance of an interferometer, or the like, with a control accuracy on the order of sub-nanometers. Control of positional movement of the substrate, pressure application, exposure, and the like, is made by an imprint control mechanism 410.

Reference Embodiment 2

In Reference Embodiment 2, a method of alignment between the mold and the substrate different from the alignment method of Reference Embodiment 1 will be described.

In this reference embodiment, explanation of the alignment method common to FIGS. 12A to 12D is omitted, and only a different constitution thereof will be described.

Figure 16A:
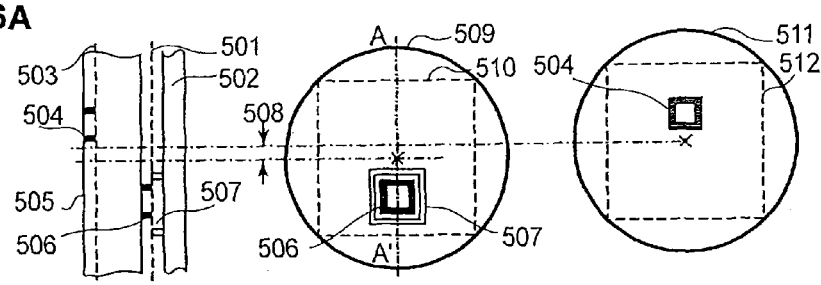
FIGS. 16A to 16C are schematic views for illustrating a method of alignment between a mold and a substrate by means of a reference substrate in Reference Embodiment 2 of the present invention, wherein FIG. 16A includes views for illustrating a case in which observation is made in a state in which the reference substrate is disposed at a predetermined position, FIG. 16B includes views for illustrating a case in which observation is made in a state in which the substrate is disposed at the second object position, and FIG. 16C includes views for illustrating a case in which observation is made in a state in which the substrate is disposed at the first object position.
Figure 16B:
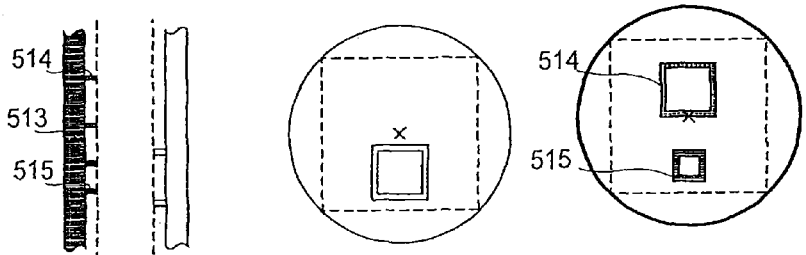
Figure 16C:
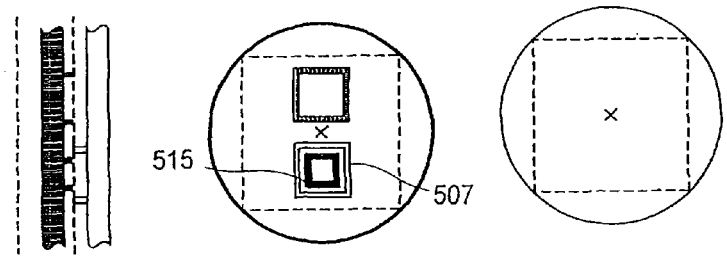

FIGS. 16A to 16C include schematic views for illustrating a mold of alignment between a mold 502 and a substrate 513.

In this reference embodiment, at both surfaces of a reference substrate 505, a first reference substrate mark 506 and a second reference substrate mark 504 are disposed, respectively. Further, an optical thickness of the reference substrate 505 is made equal to a distance between a first object position 501 and a second object position 503. Based on these features, it is possible to determine a position, to which a substrate mark should be moved at a second object position in order to align the substrate mark with a desired position of a mold mark at a first object position, at one time, as described below.

FIG. 16A includes schematic views showing the case in which the first reference substrate mark 506 of the reference substrate 505 is located at a first object position 501. Further, the second reference substrate mark 504 is located at a second object position 503. The first reference substrate mark 506 is disposed in a first image pickup image area 510 provided in a first observation area 509. Further, the second reference substrate mark 504 is disposed in a second pickup area 512 provided in a second observation area 511. A reference numeral 508 represents a difference between center positions in the first and second image pickup ranges 510 and 512.

First, the reference substrate 505 is disposed on a substrate holding portion (not shown) and, on the basis of a mold mark 507, alignment (positional adjustment) of the first reference substrate mark 506 is effected at the first object position 501 by an in-plane moving mechanism. More specifically, e.g., the alignment is effected so that the center of the first reference substrate mark 507 and the center of the mold mark 506 coincide with each other. At this time, at the second object position 503, the second reference substrate mark 504 is located and an image thereof is stored.

Thereafter, the reference substrate 505 is removed from the substrate holding portion.

Next, a method of alignment of the substrate will be described. This method is basically identical to that in Reference Embodiment 1.

More specifically, as shown in FIG. 16B, the substrate holding portion holding the substrate is disposed at a designated position (referred to as "F2-1") opposite to the mold by the in-plane moving mechanism. At this time, a first substrate mark 514 and a second substrate mark 515 are observed at the second object position. Then, alignment is effected so that the center of the first substrate mark 514 is aligned with the center of the reference substrate mark 504 observed at the second object position 503, shown in FIG. 16A, by using the in-plane moving mechanism. A difference (referred to as "E2-1") between the designated position (F2-1) of the substrate holding portion at this time and a designated position of the substrate holding portion after completion of the alignment (referred to as "S2-1") is stored.

FIG. 16C shows a state in which the substrate holding portion holding the substrate is raised, so that the first and second substrate marks 514 and 515 are disposed at the first object position 501. In this state, alignment between the mold and the substrate is ordinarily completed. Thereafter, imprint is effected by setting a designated position on the presumption that there is the difference (deviation) (E2-1) with respect to subsequent transfer onto the same substrate.

In the case in which the mold and the substrate are deviated from each other and located outside a tolerable range, similar to that in Reference Embodiment 1, the second substrate mark 515 is positionally aligned on the basis of the mold mark 507 at the first object position 501, shown in FIG. 16C, by using the in-plane moving mechanism. In this case, the alignment at the second object position 503, shown in FIG. 16B, has already been effected, so that a degree of the positional deviation is not large. A difference (referred to as "E2-2") between the designated position (F2-1) of the substrate holding portion and a position of the substrate holding portion at the time of completion of the alignment (referred to as "S2-2") is stored. Thereafter, imprint is effected by setting a designated position on the presumption that there is the difference (deviation) (E2-2) with respect to subsequent transfer onto the same substrate.

Reference Embodiment 3

In Reference Embodiment 3, a method of alignment between the mold and the substrate, different in an image processing method from the alignment method of Reference Embodiment 1, will be described.

In this reference embodiment, explanation of the alignment method common to FIGS. 12A to 12D is omitted, and only a different constitution thereof will be described.

Figure 17A:
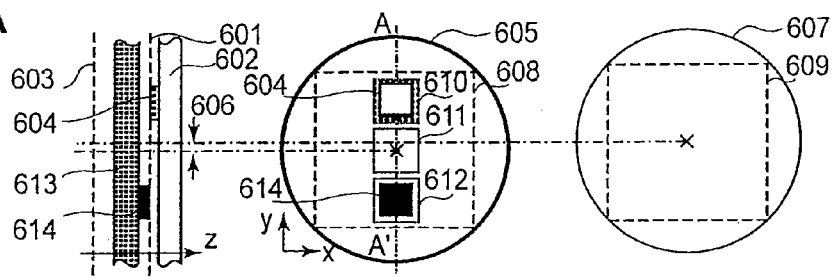
FIGS. 17A to 17D are schematic views for illustrating a signal processing method in Reference Embodiment 3 of the present invention, wherein FIG. 17A includes views for illustrating a case in which observation is made in a state in which the reference substrate is disposed at a first object position, FIG. 17B includes for illustrating a case in which observation is made in a state in which the reference substrate is disposed at a second object position, FIG. 17C includes views for illustrating a case in which observation is made in a state in which the substrate is disposed at the second object position, and FIG. 17D includes views for illustrating a case in which observation is made in a state in which the substrate is disposed at the first object position.
Figure 17B:
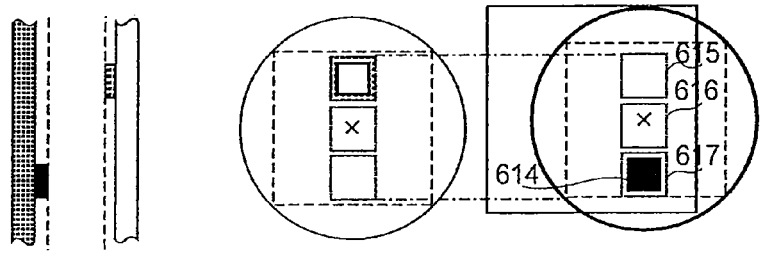
Figure 17C:
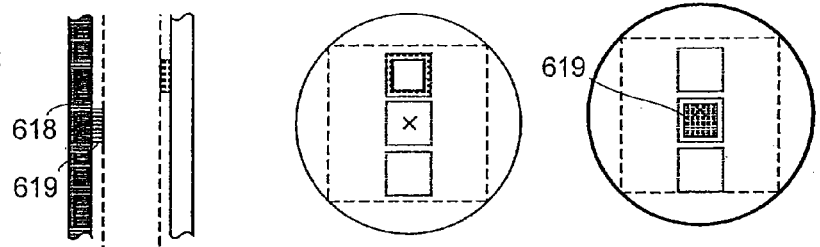

FIGS. 17A to 17C include schematic views for illustrating an image processing method in this reference embodiment.

First, the case in which a reference substrate 613 is observed at a first object position 601 will be described. FIG. 17A shows a state in which a reference substrate mark 614 of the reference substrate 613 is located at the first object position 601. In this reference embodiment, in a first image pickup area 608 in a first image pickup range 605, a first area A 610 is designated as an area including a mold mark 604 of a mold 602 on the basis of the mold mark 604. Thereafter, a first area B 611 and a first area C 613 are designated with a certain distance (interval) between adjacent areas. The reference substrate mark 614 is positionally adjusted with respect to the first area C 613 by being moved by an in-plane moving mechanism. At this time, e.g., the first area C is disposed at a desired position by effecting signal processing such that the first area A 610 and the first area C 612 are selected or extracted from an image, subjected to contrast adjustment for each extracted image, and the two extracted images are superposed. After the alignment between the reference substrate 604 and the first area C 612 is completed, the reference substrate 613 is lowered by a substrate hoisting and lowering mechanism to a second object position 603 at which the reference substrate mark 604 is observed. A reference numeral 606 represents a difference between center positions in first and second image pickup ranges 608 and 609. FIG. 17B shows a state in which the reference substrate mark 604 of the reference substrate 613 is located at the second object position 603. In this state, in a second image pickup area 602 in a second image pickup range 607, a second area C 617 is designated on the basis of the reference substrate mark 604 so as to include the reference substrate mark 604. Thereafter, a second area B 616 and a second area A 615 are designated with a certain distance (interval) between adjacent areas. Thereafter, the reference substrate 505 is removed from the substrate holding portion.

Next, a method of alignment of the substrate will be described. FIG. 17C includes views for illustrating the case in which a substrate 618 is observed at the second object position 603.

More specifically, as shown in FIG. 17C, the substrate holding portion holding the substrate is disposed at a designated position (referred to as "F3-1") opposite to the mold by the in-plane moving mechanism. At this time, a substrate mark 619 is observed at the second object position. In this state, the second area B 616 is selected or extracted from an image and superposed on an image of the second area C 617 obtained in the operation described with reference to FIG. 17B to effect positional adjustment. This positional adjustment can be performed at high speed, since the contact between the mold and the substrate is not generated at this time. Incidentally, the respective images are subjected to signal processing, such as contrast adjustment, or the like, in advance.

Next, the case in which the substrate 618 is observed at the first object position 601 will be described.

Figure 17D:
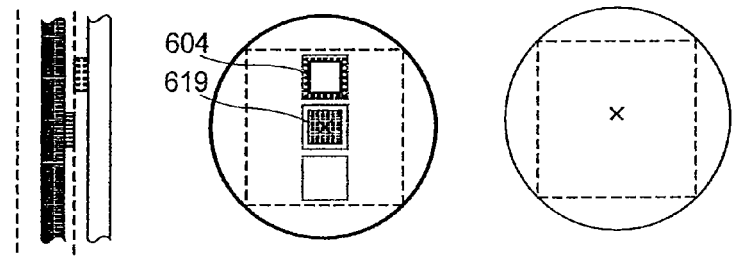

FIG. 17D shows a state in which the substrate 618 is raised in the positive direction of the z-direction by the hoisting and lowering mechanism to dispose the substrate mark 619 at the first object position 601. In this state, the alignment between the mold 602 and the substrate 618 is ordinarily completed, so that a resultant positional deviation is expected to be a level within a tolerable range. A difference (referred to as "E3-1") between the designated position (F3-1) of the substrate holding portion at this time and a designated position of the substrate holding portion after completion of the alignment (referred to as "S3-1") is stored. Thereafter, imprint is effected by setting a designated position on the presumption that there is a difference (deviation) (E3-1) with respect to subsequent transfer onto the same substrate.

In the case in which the mold and the substrate are deviated from each other and located outside a tolerable range, similar to that in Reference Embodiment 1, the alignment between the mold 602 and the substrate 618 is finally effected at the first object position 601. In this case, the alignment at the second object position 603, shown in FIG. 17C, has already been effected, so that a degree of the positional deviation is not large. A difference (referred to as "E3-2") between the designated position (F3-1) of the substrate holding portion and a position of the substrate holding portion at the time of completion of the alignment (referred to as "S3-2") is stored. Thereafter, imprint is effected by setting a designated position on the presumption that there is the difference (deviation) (E3-2) with respect to subsequent transfer onto the same substrate.

As described above, an effect of using different areas in the image pickup area of the image pickup device is that reflectances of the mold and the substrate are different from each other and, thus, the images of the mold and the substrate can be independently subjected to signal processing to facilitate an increase in accuracy of alignment. Further, it is not necessary to consider an influence of mutual interference, since the mold and the substrate are not vertically overlaid on each other, so that a degree of freedom of the mark can be increased.

Next, a method of effecting high-accuracy alignment by generating moire fringes in the mark through image processing will be described.

FIGS. 18A to 18F are schematic views for illustrating alignment marks used when alignment is effected by image-processing moire fringes in Reference Embodiment 3.

Figure 18C:
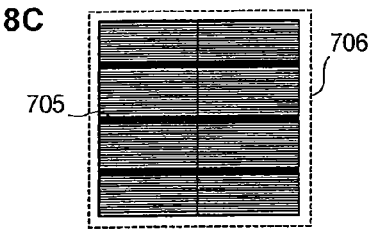

FIG. 18A shows a first mark including a bar pattern 701 with a pitch $P_1$ and a bar pattern 702 with a pitch $P_2$. FIG. 18B shows a second mark including the bar pattern 701 with the pitch $P_1$ and a bar pattern with the pitch $P_2$, wherein the bar patterns 701 and 702 have an arrangement opposite to that of the bar patterns 701 and 702 in the first mark, shown in FIG. 18A. By mutually overlaying the first mark and the second mark, a composite image 706, as shown in FIG. 18C, is formed. In this composite image 706, left-hand and right-hand moire fringes are in phase with each other. FIG. 18C shows a state in which alignment between the mark and the substrate is completed.

Incidentally, in a state in which the alignment between the mark and the substrate is not completed, the left-hand and right-hand moire images are out of phase with each other. The moire fringes have a period equal to a pitch $P_M$ represented by the following equation.

$$P_M = \frac{P_1 P_2}{|P_1 - P_2|}$$

As described above, a positional deviation between the mold and the substrate is enlarged without using optical magnification.

Figure 18D:
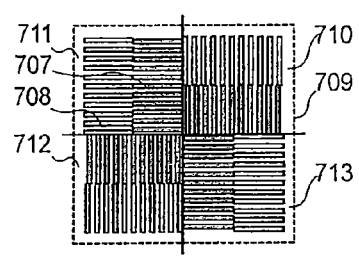
Figure 18E:
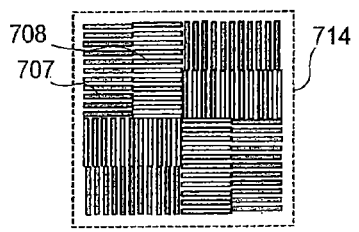
Figure 18F:
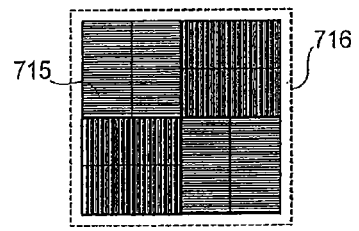

Then, the moire fringes are arranged to constitute a first mark 709 for XYθ measurement, as shown in FIG. 18D, wherein the first mark 709 includes a first area 710, a second area 711, a third area 712, a fourth area 713, a pattern 707 with a pitch $P_3$, and a pattern 708 with a pitch $P_4$. Further, the moire fringes are arranged to constitute a second mark 714 for XYθ measurement, as shown in FIG. 18E, wherein the second mark 714 includes the first to fourth areas 710-713 and the pattern 707 and 708, which are arranged opposite to those in FIG. 18D. With respect to the first mark 709, shown in FIG. 18D, and the second mark 714, shown in FIG. 18E, alignment for the y-direction and θ direction can be effected in the first and third areas 710 and 712, and alignment for the x-direction and θ direction can be effected in the second and fourth areas 711 and 713. FIG. 18F shows a composite image 716 for XYθ measurement including moire fringes 715 for XYθ measurement at the time after the alignment is completed.

The above-described apparatuses and methods according to the present invention can be utilized in manufacturing technologies, and the like, of semiconductors, optical devices, such as photonic crystals, and the like, and biochips, such as μ-TAS, and the like.

INDUSTRIAL APPLICABILITY

As described above, according to the present invention, it is possible to provide an alignment method, an imprint method, an alignment apparatus, an imprint apparatus, and a position measurement method, which have solved the above-described problems in the conventional alignment method.

While the invention has been described with reference to the structures disclosed herein, it is not confined to the details set forth and this application is intended to cover such modifications or changes as may come within the purpose of the improvements or the scope of the following claims.

The invention claimed is:

1. An imprint apparatus for performing alignment between a mold and a substrate and for imprinting a pattern of the mold to a layer of the substrate, the apparatus comprising:
   a holder configured to hold the mold;
   a stage configured to hold the substrate;
   a microscope, including an image pickup device that has a first image pickup area and a second image pickup area, the first and second image pickup areas non-overlapping with each other, the microscope being configured to detect (i) a first alignment mark, having a first periodic structure and formed in the mold, via the first image pickup area, and (ii) a second alignment mark, having a second periodic structure and formed in the substrate, via the second image pickup area; and
   a computer programmed (i) to obtain a first frequency component, corresponding to the first periodic structure, of the first alignment mark detected via the first image pickup area, and a second frequency component, corresponding to the second periodic structure, of the second alignment mark detected via the second image pickup area, (ii) to obtain a phase of a moire fringe, to be obtained if an image of the first alignment mark and an image of the second alignment mark were overlapped with each other on an image pickup area of the image pickup device, based on the first frequency component and the second frequency component, and (iii) to cause the alignment to be performed by changing relative positions of the holder and the stage, based on the obtained phase.

2. An apparatus according to claim 1, wherein the computer is programmed such that a contrast of signals obtained by the image pickup device is adjusted with respect to each of the first and second image pickup areas.

3. An apparatus according to claim 2, wherein the microscope further includes an optical element configured to adjust the contrast with respect to each of the first and second image pickup areas.

4. An apparatus according to claim 2, wherein the computer is programmed to adjust the contrast with respect to each of the first and second image pickup areas by changing one of an exposure time and a gain of the image pickup device.

5. An apparatus according to claim 2, wherein the computer is programmed to adjust the contrast with respect to each of the first and second image pickup areas by signal processing.

6. An apparatus according to claim 2, wherein the layer of the substrate is an uncured material to be cured, with the mold being pressed to the uncured material, to imprint the pattern to the layer.

7. An apparatus according to claim 1, wherein the computer is programmed to obtain the phase of the moire fringe via numerically multiplying the first frequency component by the second frequency component.

8. An alignment apparatus for performing alignment between a first member and a second member, the alignment apparatus comprising:
   a holder configured to hold the first member;
   a stage configured to hold the second member;
   a microscope, including an image pickup device that has a first image pickup area and a second image pickup area, the first and second image pickup areas non-overlapping with each other, the microscope being configured to detect (i) a first alignment mark, having a first periodic structure and formed in the first member, via the first image pickup area, and (ii) a second alignment mark, having a second periodic structure and formed in the second member, via the second image pickup area; and
   a computer programmed (i) to obtain a first frequency component, corresponding to the first periodic structure, of the first alignment mark detected via the first image pickup area, and a second frequency component, corresponding to the second periodic structure, of the second alignment mark detected via the second image pickup area, (ii) to obtain a phase of a moire fringe, to be obtained if an image of the first alignment mark and an image of the second alignment mark were overlapped with each other on an image pickup area of the image pickup device, based on the first frequency component and the second frequency component, and (iii) to cause the alignment to be performed by changing relative positions of the holder and the stage, based on the obtained phase.

9. An apparatus according to claim 1, wherein the computer is programmed to obtain the phase of the moire fringe via numerically multiplying the first frequency component by the second frequency component.

* * * * *